US012672555B2

(12) United States Patent
Yaginuma

(10) Patent No.: US 12,672,555 B2
(45) Date of Patent: Jun. 30, 2026

(54) SEMICONDUCTOR DEVICE

(71) Applicant: ROHM CO., LTD., Kyoto (JP)

(72) Inventor: Ryuta Yaginuma, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 490 days.

(21) Appl. No.: 18/246,287

(22) PCT Filed: Sep. 1, 2021

(86) PCT No.: PCT/JP2021/032072
§ 371 (c)(1),
(2) Date: Mar. 22, 2023

(87) PCT Pub. No.: WO2022/070741
PCT Pub. Date: Apr. 7, 2022

(65) Prior Publication Data
US 2023/0361006 A1      Nov. 9, 2023

(30) Foreign Application Priority Data

Oct. 1, 2020    (JP) ................................. 2020-167103

(51) Int. Cl.
*H01L 23/495* (2006.01)
*H01L 23/31* (2006.01)
(Continued)

(52) U.S. Cl.
CPC ....... *H10W 70/417* (2026.01); *H10W 70/657* (2026.01); *H10W 74/111* (2026.01);
(Continued)

(58) Field of Classification Search
CPC ........... H01L 23/49513; H01L 23/3107; H01L 23/49805; H01L 24/32; H01L 24/48; H01L 24/49; H01L 24/73
See application file for complete search history.

(56) References Cited

U.S. PATENT DOCUMENTS

| | | | | |
|---|---|---|---|---|
| 2017/0179108 A1* | 6/2017 | Okuda | ................... | H10D 30/63 |
| 2020/0168530 A1* | 5/2020 | Male | ....................... | H01L 24/33 |

FOREIGN PATENT DOCUMENTS

| | | |
|---|---|---|
| JP | 2002-261225 A | 9/2002 |
| JP | 2006-013001 A | 1/2006 |

(Continued)

OTHER PUBLICATIONS

International search Report issued in PCT/JP2021/032072, Nov. 22, 2021 (2 pages).

(Continued)

*Primary Examiner* — Walter H Swanson
(74) *Attorney, Agent, or Firm* — HSML P.C.

(57) ABSTRACT

A semiconductor device includes a semiconductor switching element, a first lead with the semiconductor element mounted thereon, a second lead, and a sealing resin. The second lead is spaced from the first lead in a first direction perpendicular to a thickness direction of the semiconductor element. The sealing resin covers a portion of the first lead, a portion of the second lead, and the semiconductor element. A resin reverse surface of the sealing resin includes a first and a second end portions spaced from each other in the first direction. The resin reverse surface also includes a third and a fourth end portions spaced from each other in a second direction perpendicular to the thickness direction and the first direction. Among the four end portions, the first lead is exposed only from the first end portion, and the second lead is exposed only from the second end portion.

15 Claims, 13 Drawing Sheets

(51) Int. Cl.

| | | |
|---|---|---|
| *H10W 70/40* | (2026.01) | |
| *H10W 70/65* | (2026.01) | |
| *H10W 74/10* | (2026.01) | |
| *H10W 72/00* | (2026.01) | |
| *H10W 90/00* | (2026.01) | |

(52) U.S. Cl.
CPC ........ *H10W 72/884* (2026.01); *H10W 90/734* (2026.01); *H10W 90/754* (2026.01)

(56) References Cited

FOREIGN PATENT DOCUMENTS

| | | | |
|---|---|---|---|
| JP | 2010-87129 A | 4/2010 | |
| JP | 2012-190936 A | 10/2012 | |
| JP | 2013-69720 A | 4/2013 | |
| JP | 2016-162964 A | 9/2016 | |
| JP | 2017-147433 A | 8/2017 | |
| WO | 2011/121756 A1 | 10/2011 | |

OTHER PUBLICATIONS

Office Action issued in corresponding Japanese Patent application No. 2022-553701, Apr. 30, 2025, and machine translation (12 pages).
Office Action issued in corresponding Japanese Patent application No. 2022-553701, Oct. 7, 2025, (9 pages).

* cited by examiner

SEMICONDUCTOR DEVICE

TECHNICAL FIELD

The present disclosure relates to a semiconductor device provided with a semiconductor element.

BACKGROUND ART

A semiconductor device provided with a switching element, such as a metal oxide semiconductor field effect transistor (MOSFET) or an insulated gate bipolar transistor (IGBT), is used in an inverter device for an electric vehicle, a hybrid vehicle, or the like. For example, Patent Document 1 discloses an example of a semiconductor device with a switching element. The semiconductor device includes a switching element, which is a MOSFET, a die pad on which the switching element is mounted, a plurality of leads electrically connected to the switching element, and a sealing resin covering the die pad, the leads, and the switching element. One of the leads is connected to the die pad, functions as a drain terminal with the die pad electrically connected to a drain electrode of the switching element, and is exposed from a reverse surface and a side surface of the sealing resin. Another one of the leads is electrically connected to a source electrode of the switching element to function as a source terminal, and is exposed from the reverse surface and the side surface of the sealing resin. The drain terminal and the source terminal are aligned side by side and exposed from the same end of the reverse surface of the sealing resin.

When such a semiconductor device is supplied with power directly from a battery, a large current of no less than 10 A will be inputted to the semiconductor device. Furthermore, since the drain terminal and the source terminal are aligned side by side at the same end of the reverse surface of the sealing resin, shorting may occur between the drain terminal and the source terminal on a wiring board on which the semiconductor device is mounted. If shorting occurs between the drain terminal and the source terminal, a large current flows directly to the downstream side of the semiconductor device. As a result, electric components arranged at the downstream side will be damaged, leading to a failure of the entire system.

PRIOR ART DOCUMENT

Patent Document

Patent Document 1: JP-A-2013-69720

SUMMARY OF THE INVENTION

Problem to be Solved by the Invention

The present disclosure has been conceived under the circumstances described above and an object thereof is to provide a semiconductor device capable of suppressing the occurrence of shorting.

Means to Solve the Problem

A semiconductor device provided by the present disclosure includes: a semiconductor element that is a switching element, the semiconductor element having an element obverse surface and an element reverse surface that face away from each other in a thickness direction; a first lead on which the semiconductor element is mounted, and that is electrically connected to the semiconductor element; a second lead that is spaced apart from the first lead in a first direction perpendicular to the thickness direction, the second lead being electrically connected to the semiconductor element; and a sealing resin covering a portion of the first lead, a portion of the second lead, and the semiconductor element. The sealing resin has a resin reverse surface facing in the same direction as the element reverse surface. The resin reverse surface includes a first end portion positioned on a first side in the first direction, a second end portion positioned on a second side in the first direction, a third end portion positioned on a first side in a second direction perpendicular to the thickness direction and the first direction, and a fourth end portion positioned on a second side in the second direction. The first lead is exposed from the first end portion, and is not exposed from any of the second end portion, the third end portion, and the fourth end portion. The second lead is exposed from the second end portion, and is not exposed from any of the first end portion, the third end portion, and the fourth end portion.

Advantages of the Invention

According to the present disclosure, the first lead and the second lead are exposed from the opposite end portions of the resin reverse surface. This suppresses the occurrence of shorting as compared to the case where the first lead and the second lead are exposed from the same end portion of the resin reverse surface.

Other features and advantages of the present disclosure will be more apparent from the detailed description given below with reference to the accompanying drawings.

BRIEF DESCRIPTION OF THE DRAWINGS

FIG. 9 is a bottom view illustrating a semiconductor device according to a fourth embodiment of the present disclosure.

FIG. 12 is a bottom view illustrating a semiconductor device according to a seventh embodiment of the present disclosure.

MODE FOR CARRYING OUT THE INVENTION

Preferred embodiments of the present disclosure are described in detail below with reference to the accompanying drawings.

In the present disclosure, the phrases "an object A is formed over an object B" and "an object A is formed on an object B" include, unless otherwise specified, "an object A is formed directly on an object B" and "an object A is formed above an object B with another object interposed between the object A and the object B". Similarly, the phrases "an object A is disposed over an object B" and "an object A is disposed on an object B" include, unless otherwise specified, "an object A is disposed directly on an object B" and "an object A is disposed above an object B with another object interposed between the object A and the object B". Similarly, the phrase "an object A is located on an object B" includes, unless otherwise specified, "an object A is located on and in contact with the object B" and "an object A is located above an object B with another object interposed between the object A and the object B". Also, the phrase "an object A overlaps with an object B as viewed in a certain direction" includes, unless otherwise specified, "an object A overlaps with the entirety of an object B" and "an object A overlaps with a portion of an object B".

With reference to FIGS. 1 to 6, a semiconductor device A1 according to a first embodiment of the present disclosure will be described. The semiconductor device A1 includes a plurality of leads 1 to 3, a semiconductor element 6, wires 71 and 72, and a sealing resin 8. The semiconductor device A1 is used in an inverter device for an electric vehicle, a hybrid vehicle, or the like, and is supplied with power directly from a battery. The usage and function of the semiconductor device A1 are not particularly limited. The semiconductor device A1 is in a dual flatpack no-leaded (DFN) package. Note that the package type of the semiconductor device A1 is not limited to DFN.

Figure 1:
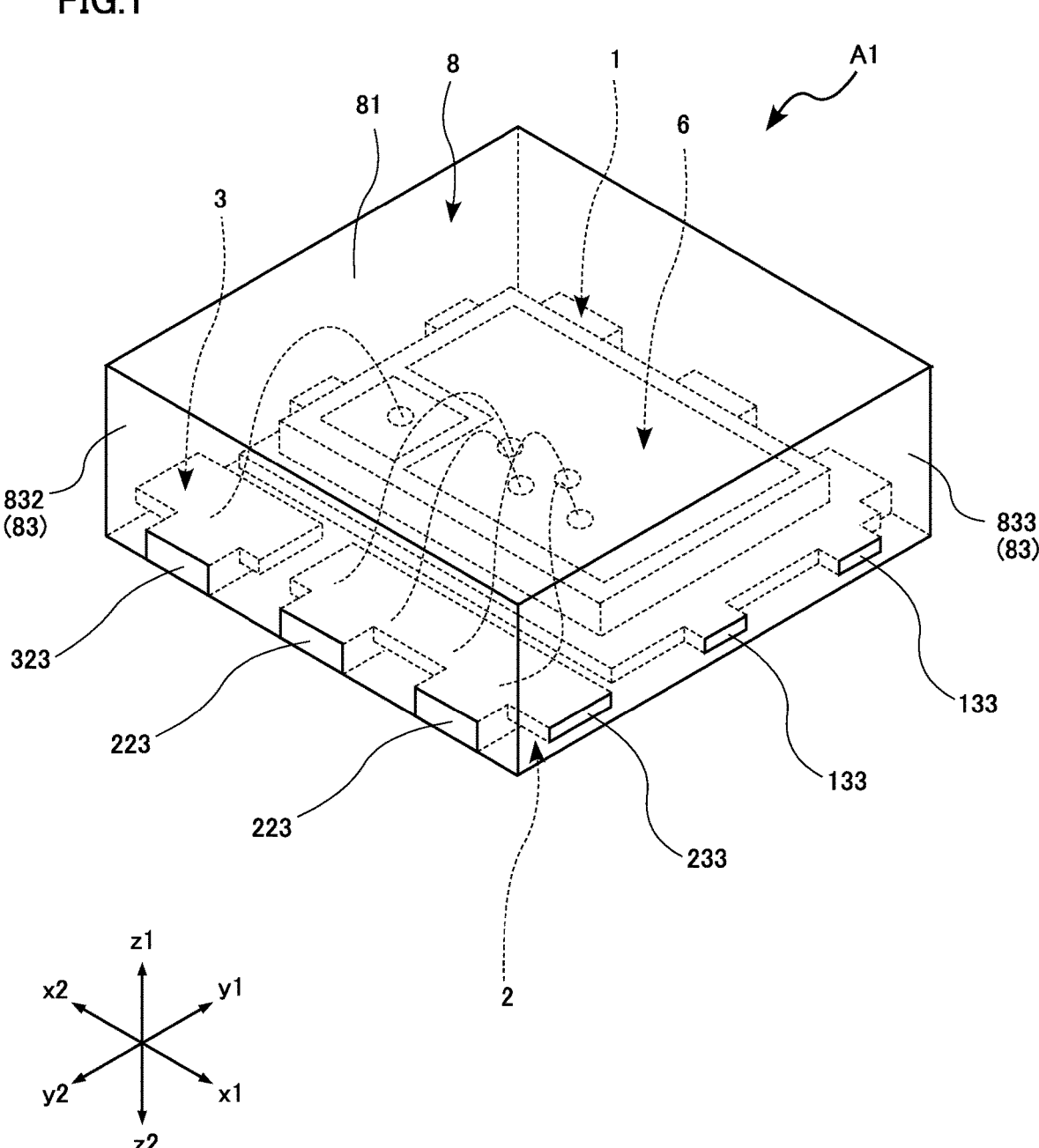
FIG. 1 is a perspective view illustrating a semiconductor device according to a first embodiment of the present disclosure.
Figure 2:
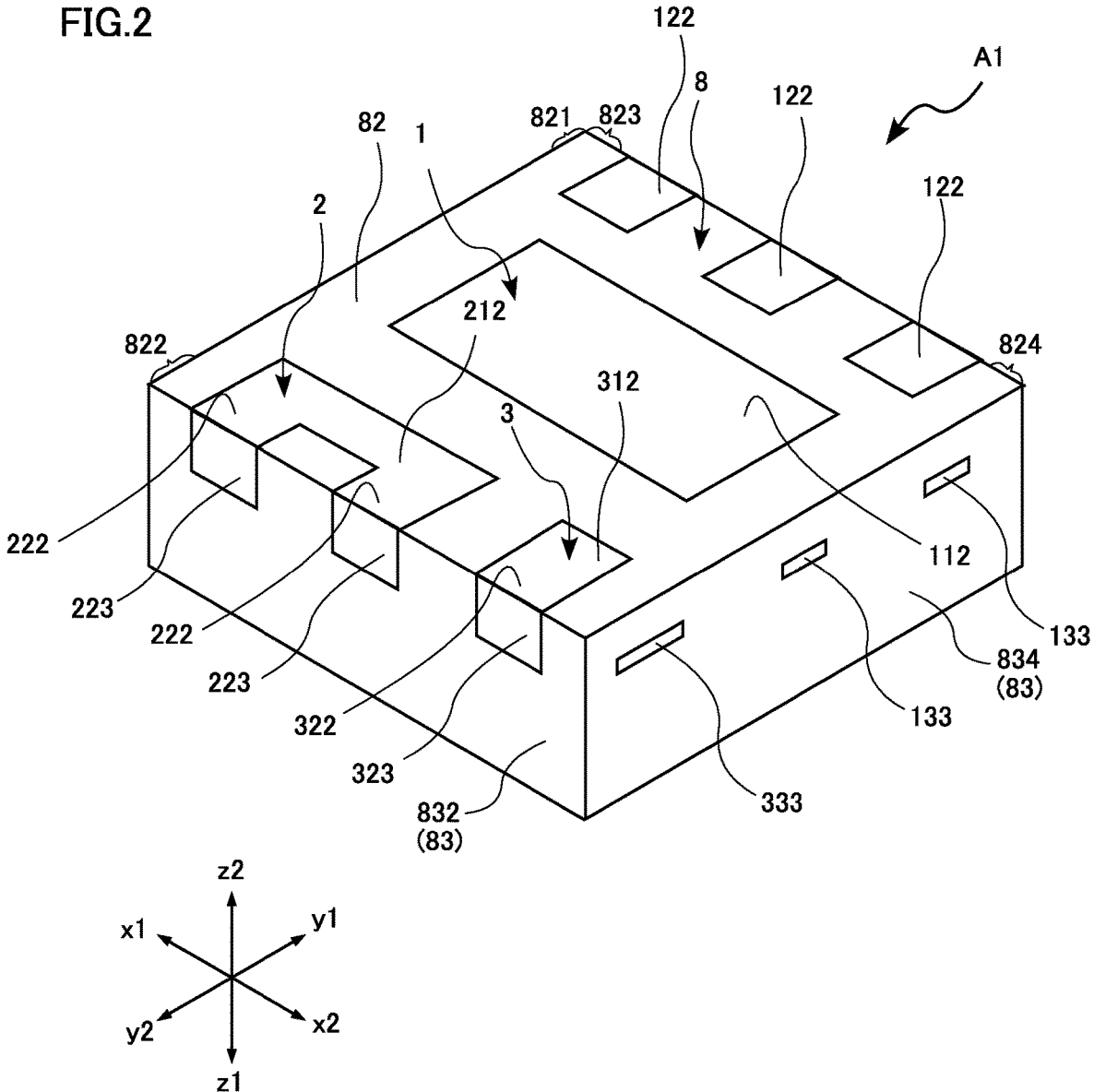
FIG. 2 is a perspective view illustrating the semiconductor device of FIG. 1, with a bottom surface thereof facing upward.
Figure 3:
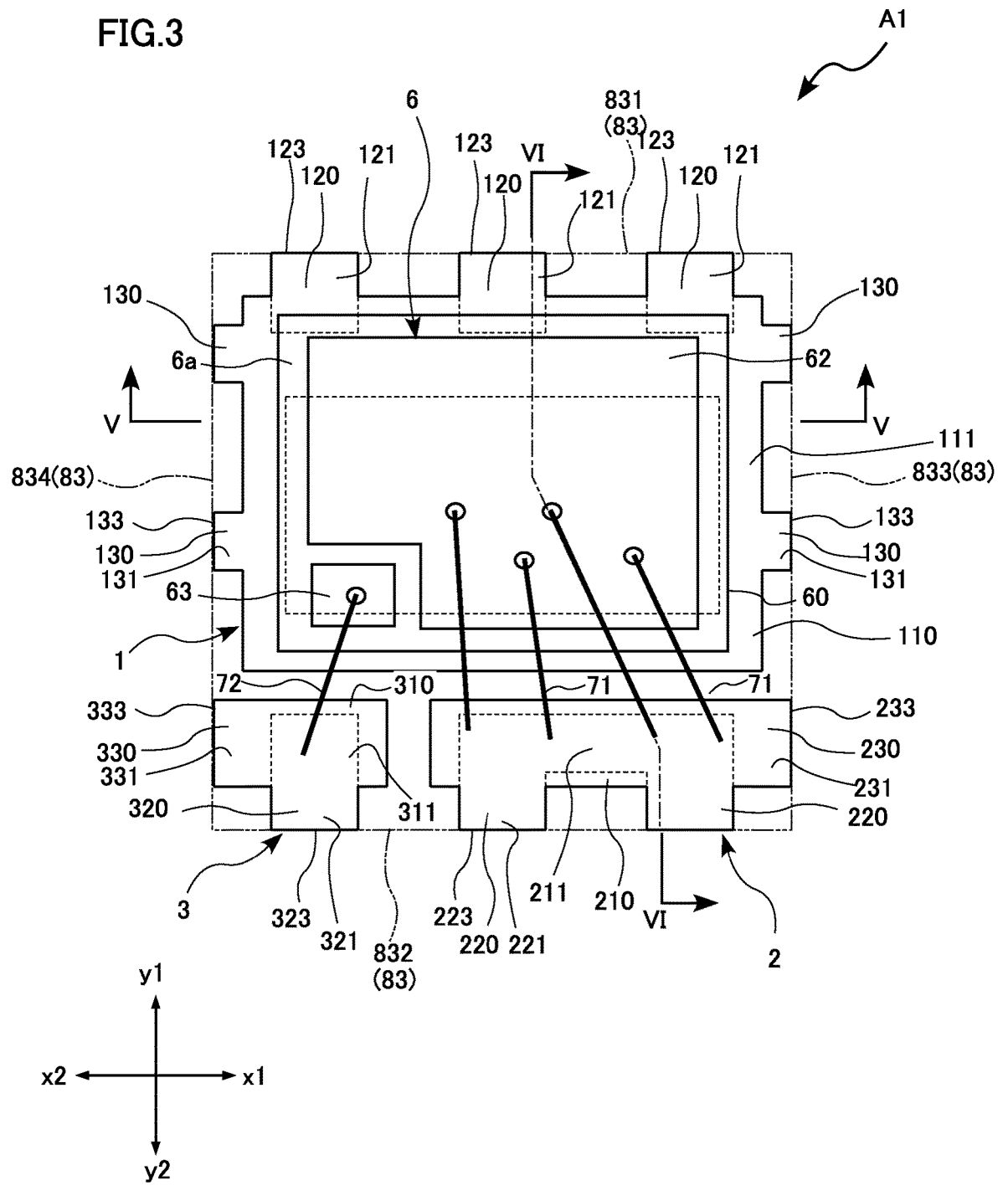
FIG. 3 is a plan view illustrating the semiconductor device of FIG. 1, as seen through a sealing resin.
Figure 4:
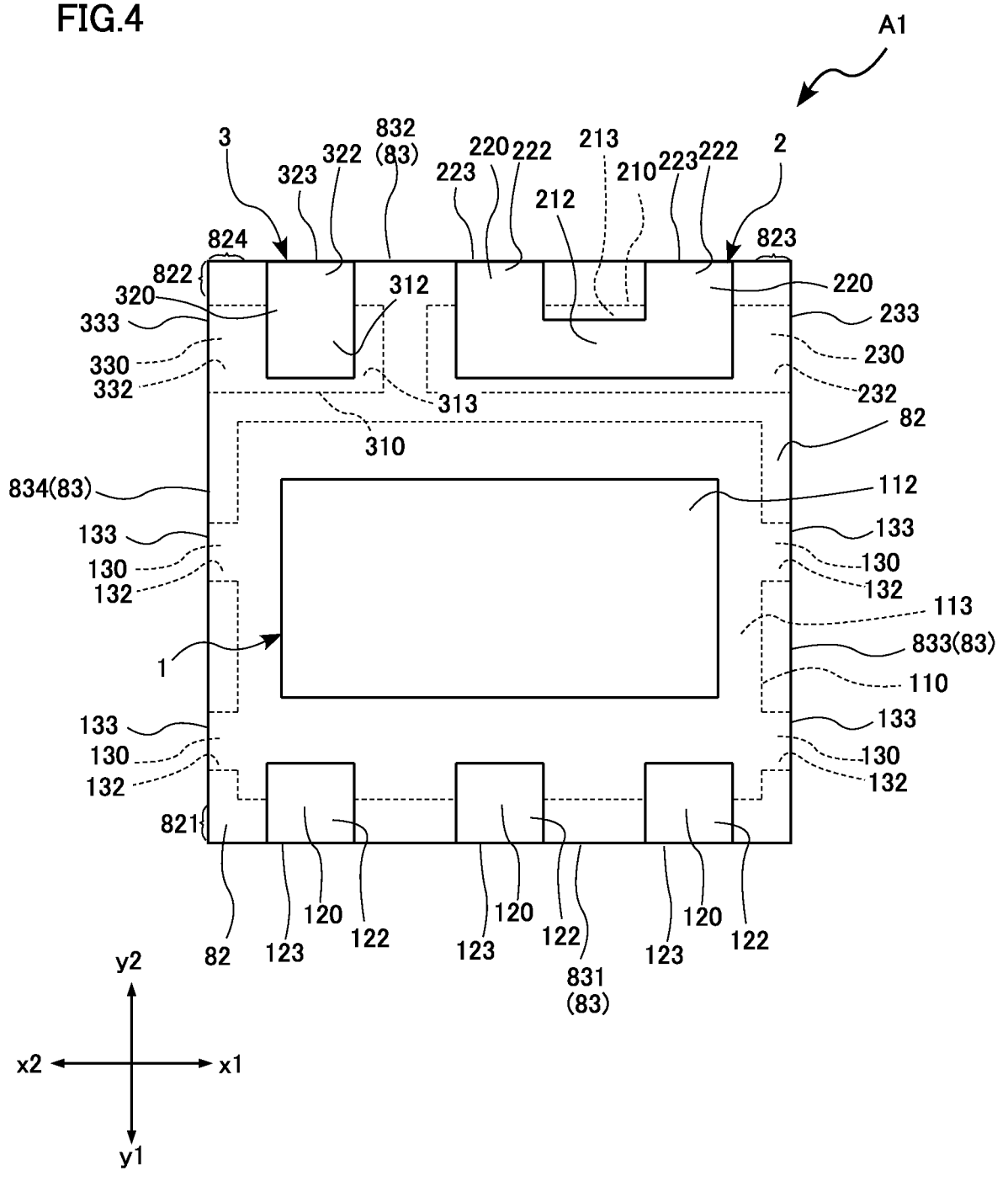
FIG. 4 is a bottom view illustrating the semiconductor device of FIG. 1.
Figure 5:
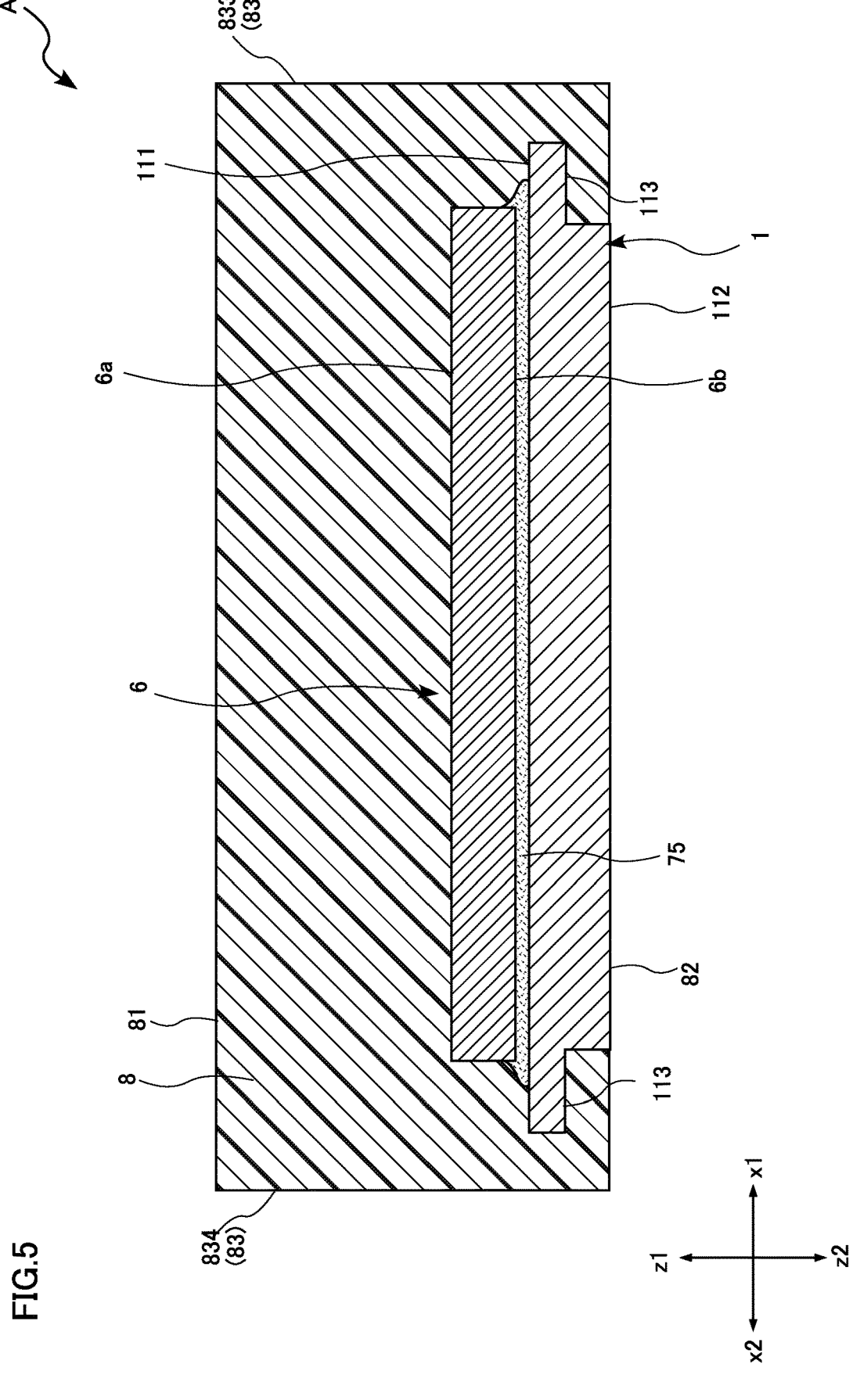
FIG. 5 is a cross-sectional view taken along line V-V of FIG. 3.
Figure 6:
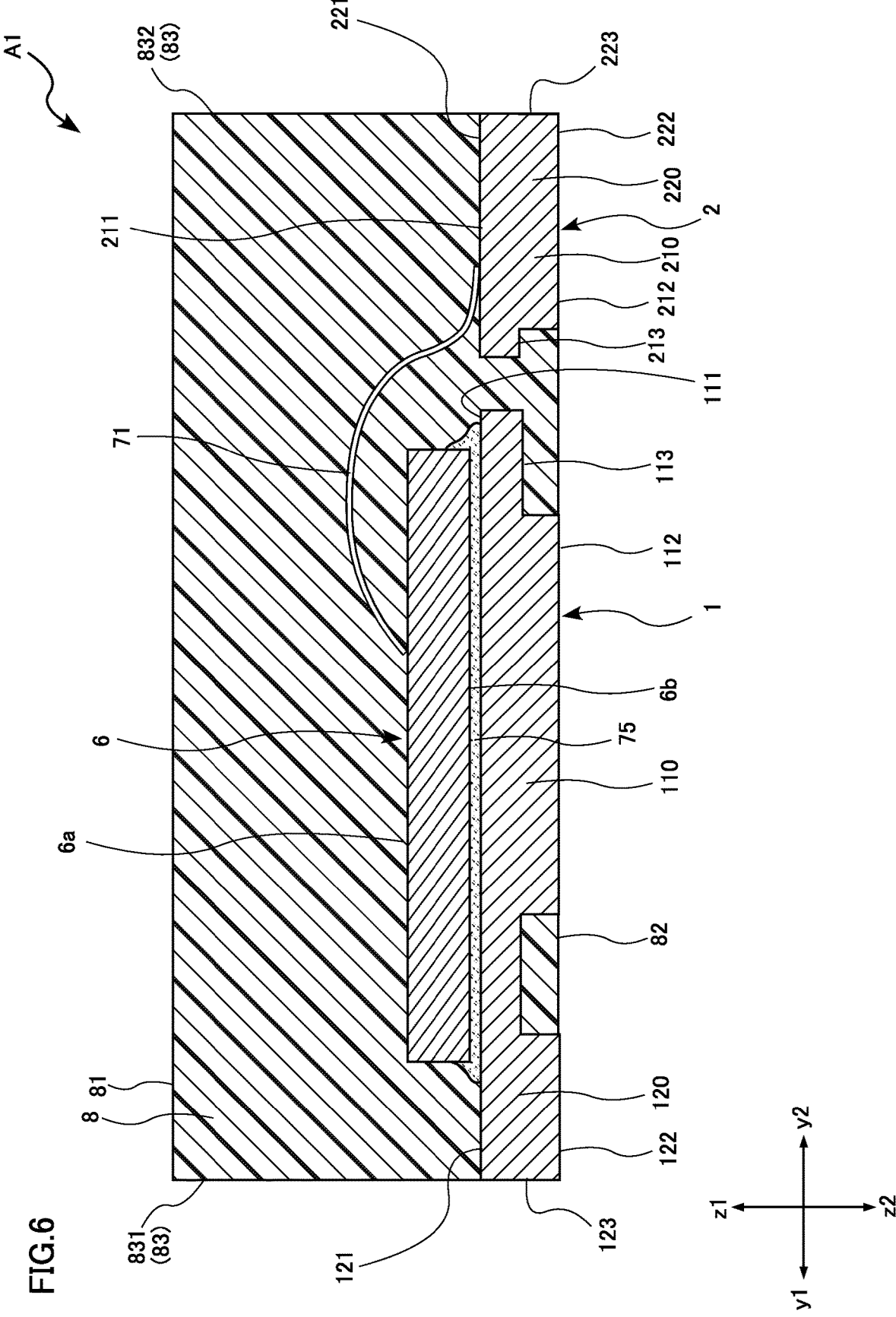
FIG. 6 is a cross-sectional view taken along line VI-VI of FIG. 3.

FIG. 1 is a perspective view illustrating the semiconductor device A1. FIG. 2 is a perspective view illustrating the semiconductor device A1, with a bottom surface thereof facing upward. FIG. 3 is a plan view illustrating the semiconductor device A1. For convenience, FIG. 3 shows the sealing resin 8 in phantom, and the outline of the sealing resin 8 is indicated by an imaginary line (two-dot chain line). FIG. 4 is a bottom view illustrating the semiconductor device A1. FIG. 5 is a cross-sectional view taken along line V-V of FIG. 3. FIG. 6 is a cross-sectional view taken along line VI-VI of FIG. 3.

The semiconductor device A1 has a rectangular shape as viewed in the thickness direction (in plan view). For convenience, the thickness direction (plan view direction) of the semiconductor device A1 is defined as z direction, the direction perpendicular to the z direction and extending along a side of the semiconductor device A1 (horizontal direction in FIG. 3) is defined as x direction, and the direction perpendicular to the z direction and the x direction (vertical direction in FIG. 3) is defined as y direction. One side in the z direction (upper side in each of FIGS. 5 and 6) is defined as z1 side, and the other side (lower side in each of FIGS. 5 and 6) is defined as z2 side. One side in the x direction (right side in FIGS. 3 and 4) is defined as x1 side, and the other side (left side in FIGS. 3 and 4) is defined as x2 side. One side in the y direction (upper side in FIG. 3) is defined as y1 side, and the other side (lower side in FIG. 3) is defined as y2 side. The z direction is an example of "thickness direction", and the y direction is an example of "first direction". The x direction is an example of "second direction". In the present embodiment, the semiconductor device A1 has dimensions of 1 mm to 3 mm in the x direction, 1 mm to 3 mm in the y direction, and 0.3 mm to 1 mm in the z direction. The dimensions of the semiconductor device A1 are not particularly limited.

The leads 1 to 3 are electrically connected to the semiconductor element 6. The leads 1 to 3 are formed by etching or punching a metal plate, for example. The leads 1 to 3 are made of metal, preferably of Cu, Ni, a Cu alloy, a Ni alloy, or a 42 alloy, for example. In the description of the present embodiment, the leads 1 to 3 are assumed to be made of Cu. Each of the leads 1 to 3 may have a thickness of 0.08 to 0.3 mm, for example, and has a thickness of approximately 0.2 mm in the present embodiment. In the following description, the leads 1 to 3 are referred to as a first lead 1, a second lead 2, and a third lead 3, respectively. They are also referred to as the leads 1 to 3, collectively.

As shown in FIG. 3, the first lead 1 in the semiconductor device A1 is provided on the y1 side in the y direction, and extends over the entire semiconductor device A1 in the x direction. The second lead 2 and the third lead 3 in the semiconductor device A1 are provided on the y2 side in the y direction, spaced apart from the first lead 1, and arranged side by side and apart from each other in the x direction. The first lead 1 has the largest dimension and the third lead 3 has the smallest dimension as viewed in the z direction.

The first lead 1 supports the semiconductor element 6, and includes a die pad portion 110, a plurality of terminal portions 120, and a plurality of connecting portions 130.

As viewed in the z direction, the die pad portion 110 is positioned at the center of the first lead 1 and has a substantially rectangular shape. The die pad portion 110 has a die-pad-portion obverse surface 111, a die-pad-portion reverse surface 112, and a die-pad-portion reverse-surface-side recess 113. The die-pad-portion obverse surface 111 and the die-pad-portion reverse surface 112 face away from each other in the z direction. The die-pad-portion obverse surface 111 faces toward the z1 side in the z direction. The die-pad-portion obverse surface 111 is the surface on which the semiconductor element 6 is mounted. The die-pad-portion reverse surface 112 faces toward the z2 side in the z direction. The die-pad-portion reverse surface 112 is exposed from the sealing resin 8 and serves as a reverse-surface terminal.

The die-pad-portion reverse-surface-side recess 113 is a portion of the die pad portion 110 recessed from the die-pad-portion reverse surface 112 toward the die-pad-portion obverse surface 111. The thickness of the die pad portion 110 (the dimension in the z direction) measured at the die-pad-portion reverse-surface-side recess 113 is approximately half the thickness measured at the die-pad-portion reverse surface 112. The die-pad-portion reverse-surface-side recess 113 is formed by half-etching, for example. As shown in FIG. 4, the die-pad-portion reverse-surface-side recess 113 is positioned around the die-pad-portion reverse surface 112. As shown in FIGS. 4 and 6, the die-pad-portion reverse-surface-side recess 113 is covered by the sealing resin 8 and not exposed from the sealing resin 8. This reduces the risk of peeling off of the first lead 1 from the sealing resin 8 toward the z2 side in the z direction. Note that the shape of the die pad portion 110 is not particularly limited. For example, the die pad portion 110 may not include the die-pad-portion reverse-surface-side recess 113.

Each of the terminal portions 120 is connected to the die pad portion 110 and has a substantially rectangular shape as viewed in the z direction. In the present embodiment, three terminal portions 120 are arranged at the end of the die pad portion 110 on the y1 side in the y direction, and aligned at equal intervals in the x direction. In the semiconductor device A1, the terminal portions 120 are arranged closest to the y1 side in the y direction. Each of the terminal portions 120 has a terminal-portion obverse surface 121, a terminal-portion reverse surface 122, and a terminal-portion end surface 123. The terminal-portion obverse surface 121 and the terminal-portion reverse surface 122 face away from each other in the z direction. The terminal-portion obverse surface 121 faces toward the z1 side in the z direction. The terminal-portion obverse surface 121 is flush with the die-pad-portion obverse surface 111. The terminal-portion reverse surface 122 faces toward the z2 side in the z direction. The terminal-portion reverse surface 122 and the die-pad-portion reverse surface 112 are spaced apart from each other in the y direction and positioned at the same level in the z direction. The terminal-portion end surface 123 is perpendicular to the terminal-portion obverse surface 121 and the terminal-portion reverse surface 122, is connected to the terminal-portion obverse surface 121 and the terminal-portion reverse surface 122, and faces toward the y1 side in the y direction. The terminal-portion end surface 123 is formed by dicing during a cutting step in a manufacturing process. The terminal-portion end surface 123 and the terminal-portion reverse surface 122 are exposed from the sealing resin 8 and connected to each other to serve as a terminal (see FIGS. 4 and 6). The shape, location and number of the terminal portions 120 are not particularly limited.

Each of the connecting portions 130 is connected to the die pad portion 110 and has a substantially rectangular shape as viewed in the z direction. In the present embodiment, two connecting portions 130 are arranged at the end of the die pad portion 110 on the x1 side in the x direction and aligned in the y direction. Another two connecting portions 130 are arranged at the end of the die pad portion 110 on the x2 side in the x direction and aligned in the y direction. The thickness of each connecting portion 130 (the dimension in the z direction) is approximately the same as the thickness of the die pad portion 110 measured at the die-pad-portion reverse-surface-side recess 113. The connecting portions 130 are formed by half-etching, for example. Each of the connecting portions 130 has a connecting-portion obverse surface 131, a connecting-portion reverse surface 132, and a connecting-portion end surface 133. The connecting-portion obverse surface 131 and the connecting-portion reverse surface 132 face away from each other in the z direction. The connecting-portion obverse surface 131 faces toward the z1 side in the z direction. The connecting-portion obverse surface 131 is flush with the die-pad-portion obverse surface 111.

Accordingly, the die-pad-portion obverse surface 111, the terminal-portion obverse surface 121, and the connecting-portion obverse surface 131 are flush with each other to form a single integrated surface (see FIG. 3). The connecting-portion reverse surface 132 faces toward the z2 side in the z direction. The connecting-portion reverse surface 132 is flush with the die-pad-portion reverse-surface-side recess 113. The connecting-portion end surface 133 connects the connecting-portion obverse surface 131 and the connecting-portion reverse surface 132, and faces outward in the x direction. The connecting-portion end surface 133 is formed by dicing during a cutting step in a manufacturing process. The connecting-portion end surface 133 is exposed from the sealing resin 8. The shape, location and number of the connecting portions 130 are not particularly limited.

The second lead 2 is arranged at the corner of the semiconductor device A1 on the x1 side in the x direction and on the y2 side in the y direction (i.e., the bottom right corner in FIG. 3) as viewed in the z direction, and includes a wire bonding portion 210, a plurality of terminal portions 220, and a connecting portion 230.

As viewed in the z direction, the wire bonding portion 210 has a substantially rectangular shape elongated in the x direction, and is positioned at the portion of the second lead 2 on the y1 side in the y direction. The wire bonding portion 210 has a wire-bonding-portion obverse surface 211, a wire-bonding-portion reverse surface 212, and a wire-bonding-portion reverse-surface-side recess 213. The wire-bonding-portion obverse surface 211 and the wire-bonding-portion reverse surface 212 face away from each other in the z direction. The wire-bonding-portion obverse surface 211 faces toward the z1 side in the z direction. The wire-bonding-portion obverse surface 211 is the surface to which the wires 71 are bonded. The wire-bonding-portion reverse surface 212 faces toward the z2 side in the z direction. The wire-bonding-portion reverse surface 212 is exposed from the sealing resin 8 and serves as a reverse-surface terminal.

The wire-bonding-portion reverse-surface-side recess 213 is a portion of the wire bonding portion 210 that is recessed from the wire-bonding-portion reverse surface 212 toward the wire-bonding-portion obverse surface 211. The thickness of the wire bonding portion 210 (the dimension in the z direction) measured at the wire-bonding-portion reverse-surface-side recess 213 is approximately half the thickness measured at the wire-bonding-portion reverse surface 212. The wire-bonding-portion reverse-surface-side recess 213 is formed by half-etching, for example. As shown in FIGS. 4 and 6, the wire-bonding-portion reverse-surface-side recess 213 is covered by the sealing resin 8 and not exposed from the sealing resin 8. This reduces the risk of peeling off of the second lead 2 from the sealing resin 8 toward the z2 side in the z direction. Note that the shape of the wire bonding portion 210 is not particularly limited. For example, the wire-bonding-portion reverse-surface-side recess 213 may be omitted.

Each of the terminal portions 220 is connected to the wire bonding portion 210 and has a substantially rectangular shape as viewed in the z direction. In the present embodiment, two terminal portions 220 are arranged at the end of the wire bonding portion 210 on the y2 side in the y direction, and aligned side by side in the x direction. In the semiconductor device A1, the terminal portions 220 are arranged closest to the y2 side in the y direction. Each of the terminal portions 220 has a terminal-portion obverse surface 221, a terminal-portion reverse surface 222, and a terminal-portion end surface 223. The terminal-portion obverse surface 221 and the terminal-portion reverse surface 222 face away from each other in the z direction. The terminal-portion obverse surface 221 faces toward the z1 side in the z direction. The terminal-portion obverse surface 221 is flush with the wire-bonding-portion obverse surface 211. The terminal-portion reverse surface 222 faces toward the z2 side in the z direction. The terminal-portion reverse surface 222 is connected to and flush with the wire-bonding-portion reverse surface 212. The terminal-portion end surface 223 is perpendicular to the terminal-portion obverse surface 221 and the terminal-portion reverse surface 222, is connected to the terminal-portion obverse surface 221 and the terminal-portion reverse surface 222, and faces toward the y2 side in the y direction. The terminal-portion end surface 223 is formed by dicing during a cutting step in a manufacturing process. The terminal-portion end surface 223 and the terminal-portion reverse surface 222 are exposed from the sealing resin 8 and connected to each other to serve as a terminal (see FIGS. 2, 4, and 6). The shape, location and number of the terminal portions 220 are not particularly limited.

The connecting portion 230 is connected to the wire bonding portion 210, and has a substantially rectangular shape as viewed in the z direction. The connecting portion 230 is arranged at the end of the wire bonding portion 210 on the x1 side in the x direction. The thickness of the connecting portion 230 (the dimension in the z direction) is approximately the same as the thickness of the wire bonding portion 210 measured at the wire-bonding-portion reverse-surface-side recess 213. The connecting portion 230 is formed by half-etching, for example. The connecting portion 230 has a connecting-portion obverse surface 231, a connecting-portion reverse surface 232, and a connecting-portion end surface 233. The connecting-portion obverse surface 231 and the connecting-portion reverse surface 232 face away from each other in the z direction. The connecting-portion obverse surface 231 faces toward the z1 side in the z direction. The connecting-portion obverse surface 231 is flush with the wire-bonding-portion obverse surface 211. Accordingly, the wire-bonding-portion obverse surface 211, the terminal-portion obverse surface 221, and the connecting-portion obverse surface 231 are flush with each other to form a single integrated surface (see FIG. 3). The connecting-portion reverse surface 232 faces toward the z2 side in the z direction. The connecting-portion reverse surface 232 is flush with the wire-bonding-portion reverse-surface-side recess 213. The connecting-portion end surface 233 connects the connecting-portion obverse surface 231 and the connecting-portion reverse surface 232, and faces toward the x1 side in the x direction. The connecting-portion end surface 233 is formed by dicing during a cutting step in a manufacturing process. The connecting-portion end surface 233 is exposed from the sealing resin 8. The shape, location and number of the connecting portion 230 are not particularly limited.

The third lead 3 is arranged at the corner of the semiconductor device A1 on the x2 side in the x direction and on the y2 side in the y direction (i.e., the bottom left corner in FIG. 3) as viewed in the z direction, and includes a wire bonding portion 310, a terminal portion 320, and a connecting portion 330.

As viewed in the z direction, the wire bonding portion 310 has a substantially rectangular shape, and is positioned at the portion of the third lead 3 on the y1 side in the y direction. The wire bonding portion 310 has a wire-bonding-portion obverse surface 311, a wire-bonding-portion reverse surface 312, and a wire-bonding-portion reverse-surface-side recess 313. The wire-bonding-portion obverse surface 311 and the wire-bonding-portion reverse surface 312 face away from each other in the z direction. The wire-bonding-portion obverse surface 311 faces toward the z1 side in the z direction. The wire-bonding-portion obverse surface 311 is the surface to which the wire 72 is bonded. The wire-bonding-portion reverse surface 312 faces toward the z2 side in the z direction. The wire-bonding-portion reverse surface 312 is exposed from the sealing resin 8 and serves as a reverse-surface terminal.

The wire-bonding-portion reverse-surface-side recess 313 is a portion of the wire bonding portion 310 that is recessed from the wire-bonding-portion reverse surface 312 toward the wire-bonding-portion obverse surface 311. The thickness of the wire bonding portion 310 (the dimension in the z direction) measured at the wire-bonding-portion reverse-surface-side recess 313 is approximately half the thickness measured at the wire-bonding-portion reverse surface 312. The wire-bonding-portion reverse-surface-side recess 313 is formed by half-etching, for example. As shown in FIG. 4, the wire-bonding-portion reverse-surface-side recess 313 is covered by the sealing resin 8 and not exposed from the sealing resin 8. This reduces the risk of peeling off of the third lead 3 from the sealing resin 8 toward the z2 side in the z direction. Note that the shape of the wire bonding portion 310 is not particularly limited. For example, the wire-bonding-portion reverse-surface-side recess 313 may be omitted.

The terminal portion 320 is connected to the wire bonding portion 310, and has a substantially rectangular shape as viewed in the z direction. The terminal portion 320 is arranged at the end of the wire bonding portion 310 on the y2 side in the y direction. In the semiconductor device A1, the terminal portion 320 is arranged closest to the y2 side in the y direction. The terminal portion 320 has a terminal-portion obverse surface 321, a terminal-portion reverse surface 322, and a terminal-portion end surface 323. The terminal-portion obverse surface 321 and the terminal-portion reverse surface 322 face away from each other in the z direction. The terminal-portion obverse surface 321 faces toward the z1 side in the z direction. The terminal-portion obverse surface 321 is flush with the wire-bonding-portion obverse surface 311. The terminal-portion reverse surface 322 faces toward the z2 side in the z direction. The terminal-portion reverse surface 322 is connected to and flush with the wire-bonding-portion reverse surface 312. The terminal-portion end surface 323 is perpendicular to the terminal-portion obverse surface 321 and the terminal-portion reverse surface 322, is connected to the terminal-portion obverse surface 321 and the terminal-portion reverse surface 322, and faces toward the y2 side in the y direction. The terminal-portion end surface 323 is formed by dicing during a cutting step in a manufacturing process. The terminal-portion end surface 323 and the terminal-portion reverse surface 322 are exposed from the sealing resin 8 and connected to each other to serve as a terminal (see FIGS. 2 and 4). The shape, location and number of the terminal portion 320 are not particularly limited.

The connecting portion 330 is connected to the wire bonding portion 310, and has a substantially rectangular shape as viewed in the z direction. The connecting portion 330 is arranged at the end of the wire bonding portion 310 on the x2 side in the x direction. The thickness of the connecting portion 330 (the dimension in the z direction) is approximately the same as the thickness of the wire bonding portion 310 measured at the wire-bonding-portion reverse-surface-side recess 313. The connecting portion 330 is formed by half-etching, for example. The connecting portion 330 has a connecting-portion obverse surface 331, a connecting-portion reverse surface 332, and a connecting-portion end surface 333. The connecting-portion obverse surface 331 and the connecting-portion reverse surface 332 face away from each other in the z direction. The connecting-portion obverse surface 331 faces toward the z1 side in the z direction. The connecting-portion obverse surface 331 is flush with the wire-bonding-portion obverse surface 311. Accordingly, the wire-bonding-portion obverse surface 311, the terminal-portion obverse surface 321, and the connecting-portion obverse surface 331 are flush with each other to form a single integrated surface (see FIG. 3). The connecting-portion reverse surface 332 faces toward the z2 side in the z direction. The connecting-portion reverse surface 332 is flush with the wire-bonding-portion reverse-surface-side recess 313. The connecting-portion end surface 333 connects the connecting-portion obverse surface 331 and the connecting-portion reverse surface 332, and faces toward the x2 side in the x direction. The connecting-portion end surface 333 is formed by dicing during a cutting step in a manufacturing process. The connecting-portion end surface 333 is exposed from the sealing resin 8. The shape, location and number of the connecting portion 330 are not particularly limited.

Plating layers may be formed on the surfaces of the leads 1 to 3. Each of the plating layers may be formed by stacking a Ni plating layer, a Pd plating layer, and a Au plating layer in sequence to facilitate bonding of the wires 71 and 72, or may be made of a Sn-based alloy to improve solder wettability.

The semiconductor element 6 performs electrical functions of the semiconductor device A1. The semiconductor element 6 is a switching element. In the present embodiment, the semiconductor element 6 is a transistor such as a metal-oxide-semiconductor field-effect transistor (MOS-FET). Note that the semiconductor element 6 may be an insulated gate bipolar transistor (IGBT) or a high electron mobility transistor (HEMT). The semiconductor element 6 includes an element body 60, a first electrode 61, a second electrode 62, and a third electrode 63.

The element body 60 is in the form of a rectangular plate as viewed in the z direction. The element body 60 is made of a semiconductor material. In the present embodiment, the element body 60 is made of silicon (Si). The material of the element body 60 is not particularly limited, and may be made of another material such as silicon carbide (SiC) or gallium nitride (GaN). The element body 60 has an element obverse surface 6a and an element reverse surface 6b. The element obverse surface 6a and the element reverse surface 6b face away from each other in the z direction. The element obverse surface 6a faces toward the z1 side in the z direction, which is the side opposite from the first lead 1 in the z direction. The element reverse surface 6b faces toward the z2 side in the z direction, and faces the first lead 1. The first electrode 61 is arranged on the element reverse surface 6b. The second electrode 62 and the third electrode 63 are arranged on the element obverse surface 6a. In the present embodiment, the first electrode 61 is a drain electrode, the second electrode 62 is a source electrode, and the third electrode 63 is a gate electrode.

The semiconductor element 6 is mounted at the center of the die-pad-portion obverse surface 111 of the first lead 1 via a bonding member 75. In the present embodiment, the bonding member 75 is a conductive bonding member, such as solder. The bonding member 75 may be another conductive bonding member, such as silver paste or sintered silver. The element reverse surface 6b of the semiconductor element 6 is bonded to the die-pad-portion obverse surface 111 of the first lead 1 via the bonding member 75. The first electrode 61 of the semiconductor element 6 is electrically connected to the first lead 1 via the bonding member 75. As such, the first lead 1 is electrically connected to the first electrode 61 (drain electrode) of the semiconductor element 6 to function as a drain terminal.

The wires 71 and 72 electrically connect the semiconductor element 6 and the leads 2 and 3. The wires 71 and 72 are made of metal such as Cu, Au, Ag, or A1, for example. The material of the wires 71 and 72 is not particularly limited. As shown in FIG. 3, the wires 71 are connected to the second electrode 62 of the semiconductor element 6 and the wire-bonding-portion obverse surface 211 of the second lead 2. As such, the second lead 2 is electrically connected to the second electrode 62 (source electrode) of the semiconductor element 6 to function as a source terminal. In the present embodiment, four wires 71 are provided and bonded to the wire-bonding-portion obverse surface 211. The wire 72 is connected to the third electrode 63 of the semiconductor element 6 and the wire-bonding-portion obverse surface 311 of the third lead 3. As such, the third lead 3 is electrically connected to the third electrode 63 (gate electrode) of the semiconductor element 6 to function as a gate terminal. The number of wires 71 and the number of wires 72 are not particularly limited. Instead of the wires 71 and 72, a metal plate made of Cu, for example, may be provided.

The semiconductor device A1 is supplied with power directly from a battery, and a current is input from the first electrode 61 to the semiconductor element 6 via the first lead 1 and outputted from the second electrode 62 via the second lead 2. Accordingly, a large current from 10 A to 30 A flows through the first lead 1 and the second lead 2. However, the semiconductor device A1 switches between a conductive state and a non-conductive state according to a pulse signal inputted to the third electrode 63 via the third lead 3. This prevents the continuous flow of a large current from the first lead 1 to the second lead 2. In the event of shorting between the first lead 1 and the second lead 2, however, a large current supplied from the battery will flow continuously to the downstream side of the semiconductor device A1.

The sealing resin 8 covers portions of the leads 1 to 3, the semiconductor element 6, the bonding member 75, and the wires 71 and 72. The sealing resin 8 is made of a black epoxy resin, for example. The material of the sealing resin 8 is not particularly limited.

The sealing resin 8 has a resin obverse surface 81, a resin reverse surface 82, and four resin side surfaces 83. The resin obverse surface 81 and the resin reverse surface 82 face away from each other in the z direction. The resin obverse surface 81 faces toward the z1 side in the z direction, and the resin reverse surface 82 faces toward the z2 side in the z direction. As shown in FIGS. 2 and 4, the resin reverse surface 82 has a first end portion 821 and a second end portion 822. The first end portion 821 is a portion of the resin reverse surface 82 on the y1 side in the y direction. The second end portion 822 is a portion of the resin reverse surface 82 on the y2 side in the y direction. The resin reverse surface 82 also has a third end portion 823 and a fourth end portion 824. The third end portion 823 is a portion of the resin reverse surface 82 on the x1 side in the x direction. The fourth end portion 824 is a portion of the resin reverse surface 82 on the x2 side in the x direction.

Each of the four resin side surfaces 83 is perpendicular to the resin obverse surface 81 and the resin reverse surface 82, is connected to the resin obverse surface 81 and the resin reverse surface 82, and faces outward in either the x direction or the y direction. The resin side surfaces 83 are formed by dicing during a cutting step in a manufacturing process. The four resin side surfaces 83 include a first resin side surface 831, a second resin side surface 832, a third resin side surface 833, and a fourth resin side surface 834. The first resin side surface 831 and the second resin side surface 832 face away from each other in the y direction. The first resin side surface 831 is offset toward the y1 side in the y direction and faces toward the y1 side in the y direction, and the second resin side surface 832 is offset toward the y2 side in the y direction and faces toward the y2 side in the y direction. The third resin side surface 833 and the fourth resin side surface 834 face away from each other in the x direction. The third resin side surface 833 is offset toward the x1 side in the x direction and faces toward the x1 side in the x direction, and the fourth resin side surface 834 is offset toward the x2 side in the x direction and faces toward the x2 side in the x direction.

The terminal-portion end surfaces 123 of the first lead 1 are exposed from the first resin side surface 831, and are flush with the first resin side surface 831. The terminal-portion end surfaces 223 of the second lead 2 and the terminal-portion end surface 323 of the third lead 3 are exposed from the second resin side surface 832, and are flush with the second resin side surface 832. Some of the connecting-portion end surfaces 133 of the first lead 1 and the connecting-portion end surface 233 of the second lead 2, which face toward the x1 side, are exposed from the third resin side surface 833 and flush with the third resin side surface 833. The rest of the connecting-portion end surfaces 133 of the first lead 1 and the connecting-portion end surface 333 of the third lead 3, which face toward the x2 side, are exposed from the fourth resin side surface 834 and flush with the fourth resin side surface 834. The die-pad-portion reverse surface 112 and the terminal-portion reverse surfaces 122 of the first lead 1, the wire-bonding-portion reverse surface 212 and the terminal-portion reverse surfaces 222 of the second lead 2, and the wire-bonding-portion reverse surface 312 and the terminal-portion reverse surface 322 of the third lead 3 are exposed from the resin reverse surface 82 of the sealing resin 8, and are flush with the resin reverse surface 82.

The terminal-portion reverse surfaces 122 of the first lead 1 are exposed from the first end portion 821 of the resin reverse surface 82. On the other hand, the connecting-portion reverse surfaces 132 of the first lead 1 are not exposed from the resin reverse surface 82. Accordingly, the first lead 1 is exposed from the first end portion 821 of the resin reverse surface 82, but is not exposed from any of the second end portion 822, the third end portion 823, and the fourth end portion 824. The terminal-portion reverse surfaces 222 of the second lead 2 and the terminal-portion reverse surface 322 of the third lead 3 are exposed from the second end portion 822 of the resin reverse surface 82. On the other hand, the connecting-portion reverse surface 232 of the second lead 2 and the connecting-portion reverse surface 332 of the third lead 3 are not exposed from the resin reverse surface 82. Accordingly, the second lead 2 and the third lead 3 are exposed from the second end portion 822 of the resin reverse surface 82, but are not exposed from any of the first end portion 821, the third end portion 823, and the fourth end portion 824.

Next, advantages of the semiconductor device A1 will be described.

According to the present embodiment, the first lead 1 is exposed from the first end portion 821 of the resin reverse surface 82, but is not exposed from any of the second end portion 822, the third end portion 823, and the fourth end portion 824. The second lead 2 is exposed from the second end portion 822 of the resin reverse surface 82, but is not exposed from any of the first end portion 821, the third end portion 823, and the fourth end portion 824. In other words, the first lead 1 and the second lead 2 are exposed from the opposite end portions of the resin reverse surface 82 in the y direction. As such, the semiconductor device A1 can suppress the occurrence of shorting as compared to the case where the first lead 1 and the second lead 2 are exposed from the same end portion of the resin reverse surface 82.

According to the present embodiment, the die pad portion 110 of the first lead 1 has the die-pad-portion reverse surface 112 exposed from the resin reverse surface 82. With the die-pad-portion reverse surface 112 bonded to a wiring board, the first lead 1 can transfer the heat generated by the semiconductor element 6 to the wiring board so as to dissipate the heat.

According to the present embodiment, the die-pad-portion reverse surface 112 of the first lead 1 is spaced apart from the terminal-portion reverse surfaces 122, and a portion of the die-pad-portion reverse-surface-side recess 113 located therebetween is covered with the sealing resin 8. This further reduces the risk of peeling off of the first lead 1 from the sealing resin 8 toward the z2 side in the z direction, as compared to the case where the die-pad-portion reverse surface 112 and the terminal-portion reverse surfaces 122 are connected to each other. According to the present embodiment, the first lead 1 includes the terminal portions 120. The terminal-portion reverse surfaces 122 of the terminal portions 120 are spaced apart from each other, and portions of the die-pad-portion reverse-surface-side recess 113 located therebetween are covered with the sealing resin 8. This further reduces the risk of peeling off of the first lead 1 from the sealing resin 8 toward the z2 side in the z direction, as compared to the case where a single terminal portion 120 is provided.

According to the present embodiment, the wire bonding portion 210 of the second lead 2 has a substantially rectangular shape elongated in the x direction as viewed in the z direction. The wire-bonding-portion obverse surface 211 is flush with the terminal-portion obverse surfaces 221 and the connecting-portion obverse surface 231 that are provided around the wire-bonding-portion obverse surface 211, and thereby forms a large integrated surface. This makes it possible to bond a large number of wires 71 to the second lead 2. According to the present embodiment, the overall shape of the surface of the second lead 2 that is exposed from the resin reverse surface 82 (i.e., the wire-bonding-portion reverse surface 212 and the two terminal-portion reverse surfaces 222) is a U-shape that is open on the y2 side in the y direction. In other words, the wire-bonding-portion reverse-surface-side recess 213 is covered with the sealing resin 8 between the two terminal portions 220. This further reduces the risk of peeling off of the second lead 2 from the sealing resin 8 toward the z2 side in the z direction, as compared to the case where the two terminal portions 220 of the second lead 2 are connected to each other to provide a single terminal portion 220. The wire-bonding-portion reverse surface 212 has the shape of a single rectangle elongated in the x direction. An area of the wire-bonding-portion obverse surface 211, which overlaps with the wire-bonding-portion reverse surface 212 as viewed in the z direction, allows stable bonding of the wires 71. In this way, the wire-bonding-portion obverse surface 211 of the second lead 2 has a larger bonding area for stable bonding of the wires 71, as compared to the case where the wire-bonding-portion reverse surface 212 is divided into multiple areas in the x direction.

FIGS. 7 to 13 show other embodiments of the present disclosure. In these figures, elements that are the same as or similar to those in the foregoing embodiment are provided with the same reference signs as in the foregoing embodiment.

Figure 7:
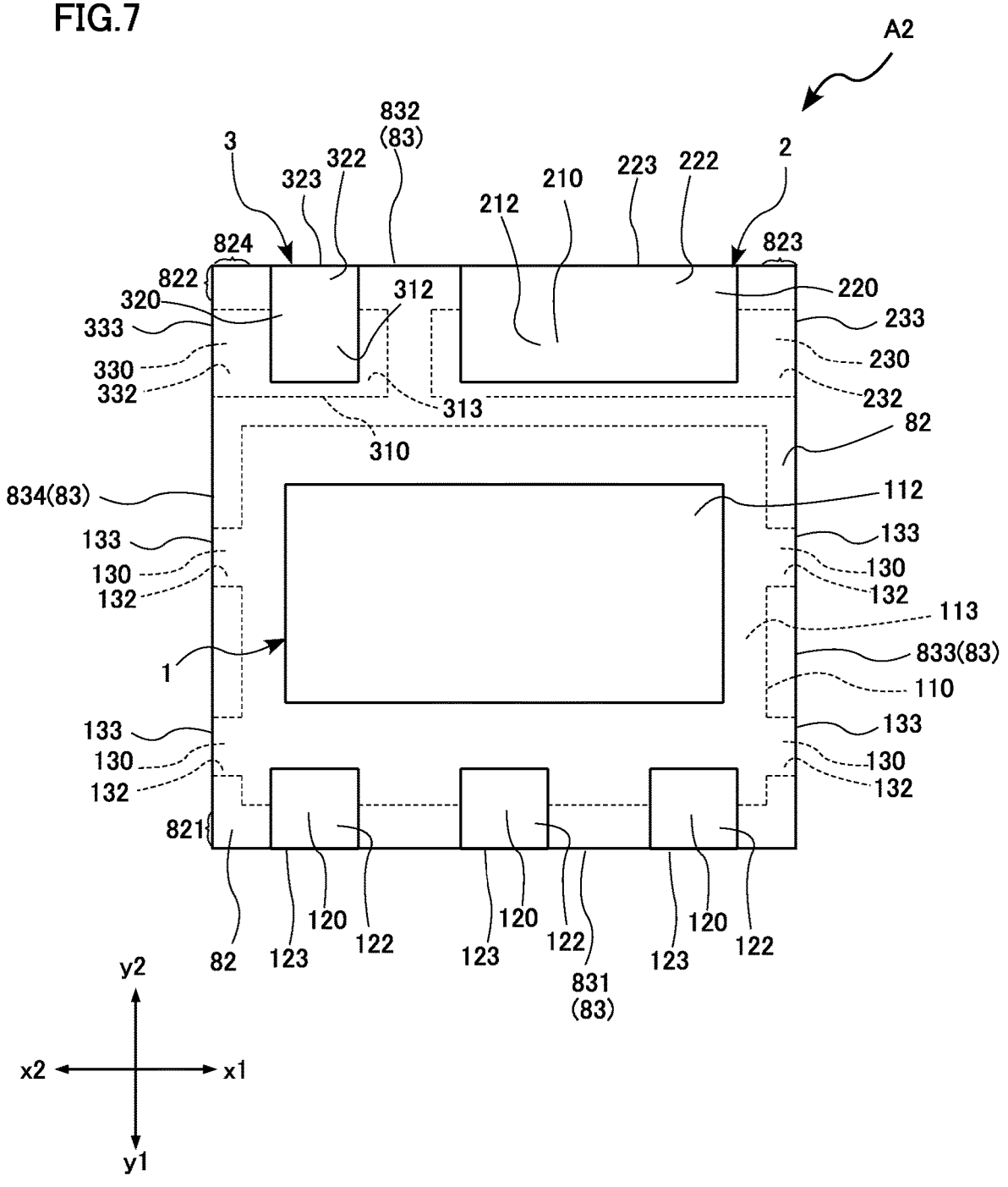
FIG. 7 is a bottom view illustrating a semiconductor device according to a second embodiment of the present disclosure.

FIG. 7 is a bottom view illustrating a semiconductor device A2 according to a second embodiment of the present disclosure, and corresponds to FIG. 4. The semiconductor device A2 according to the present embodiment is different from the semiconductor device A1 according to the first embodiment in the shape of the second lead 2.

The second lead 2 according to the second embodiment includes only a single terminal portion 220. The terminal portion 220 is formed by connecting the two terminal portions 220 of the second lead 2 according to the first embodiment into a single terminal portion 220. As such, according to the second embodiment, the overall shape of the surface of the second lead 2 that is exposed from the resin reverse surface 82 (i.e., the wire-bonding-portion reverse surface 212 and the terminal-portion reverse surface 222) is a rectangle extending to the end portion on the y2 side in the y direction, instead of a U-shape that is open on the y2 side in the y direction as seen in the first embodiment.

In the present embodiment, the first lead 1 and the second lead 2 are also similarly exposed from the opposite end portions of the resin reverse surface 82 in the y direction. As such, the semiconductor device A2 can suppress the occurrence of shorting as compared to the case where the first lead 1 and the second lead 2 are exposed from the same end portion of the resin reverse surface 82. Since the die pad portion 110 of the first lead 1 has the die-pad-portion reverse surface 112 that is exposed from the resin reverse surface 82, the first lead 1 can transfer the heat generated by the semiconductor element 6 to a wiring board so as to dissipate the heat. Furthermore, the die-pad-portion reverse surface 112 of the first lead 1 is spaced apart from the terminal-portion reverse surfaces 122, and the terminal-portion reverse surfaces 122 are spaced apart from each other as well. This further reduces the risk of peeling off of the first lead 1 from the sealing resin 8 toward the z2 side in the z direction. In addition, the second lead 2 has a large integrated surface formed by connecting the wire-bonding-portion obverse surface 211, the terminal-portion obverse surface 221, and the connecting-portion obverse surface 231 that are flush with each other. This makes it possible to bond a large number of wires 71. Furthermore, according to the present embodiment, the overall shape of the surface of the second lead 2 that is exposed from the resin reverse surface 82 is a rectangle extending to the end portion on the y2 side in the y direction. Accordingly, the area that allows stable bonding of the wires 71 is even larger than in the first embodiment.

The dimension of the terminal portion 220 in the x direction according to the present embodiment is approximately three times as large as the dimension of each terminal portion 220 in the first embodiment. However, the present disclosure is not limited to this. For example, the dimension of the terminal portion 220 in the x direction may be approximately the same as the dimension of each terminal portion 220 in the x direction according to the first embodiment. In other words, the second lead 2 according to the second embodiment may include one of the terminal portions 220 of the second lead 2 according to the first embodiment.

Figure 8:
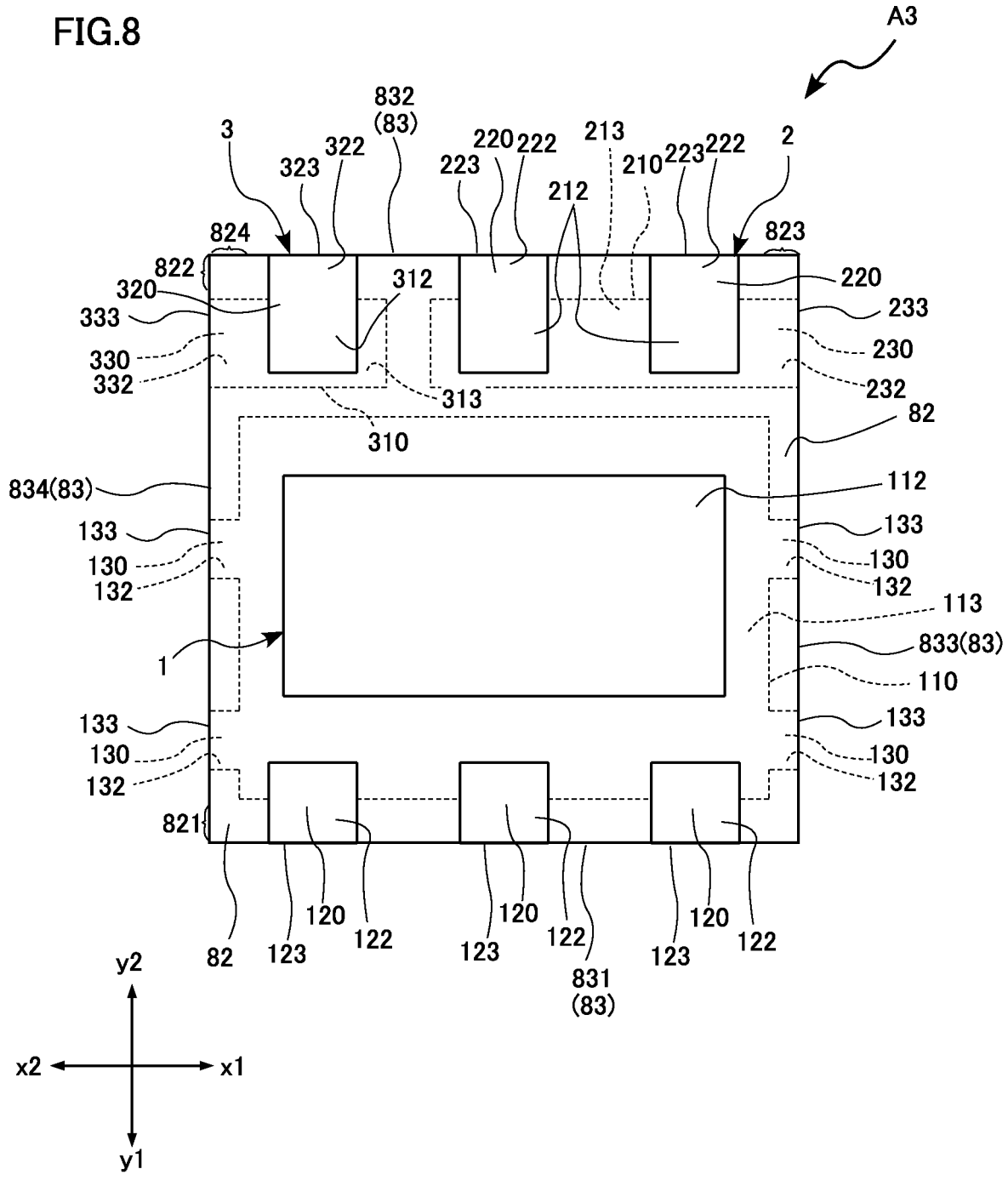
FIG. 8 is a bottom view illustrating a semiconductor device according to a third embodiment of the present disclosure.

FIG. 8 is a bottom view illustrating a semiconductor device A3 according to a third embodiment of the present disclosure, and corresponds to FIG. 4. The semiconductor device A3 according to the present embodiment is different from the semiconductor device A1 according to the first embodiment in the shape of the second lead 2.

According to the third embodiment, the second lead 2 has two wire-bonding-portion reverse surfaces 212 in the x direction, and the resin reverse surface 82 is positioned between the two wire-bonding-portion reverse surfaces 212 to separate them.

In the present embodiment, the first lead 1 and the second lead 2 are also similarly exposed from the opposite end portions of the resin reverse surface 82 in the y direction. As such, the semiconductor device A3 can suppress the occurrence of shorting as compared to the case where the first lead 1 and the second lead 2 are exposed from the same end portion of the resin reverse surface 82. Since the die pad portion 110 of the first lead 1 has the die-pad-portion reverse surface 112 that is exposed from the resin reverse surface 82, the first lead 1 can transfer the heat generated by the semiconductor element 6 to a wiring board so as to dissipate the heat. Furthermore, the die-pad-portion reverse surface 112 of the first lead 1 is spaced apart from the terminal-portion reverse surfaces 122, and the terminal-portion reverse surfaces 122 are spaced apart from each other as well. This further reduces the risk of peeling off of the first lead 1 from the sealing resin 8 toward the z2 side in the z direction. In addition, the second lead 2 has a large integrated surface formed by connecting the wire-bonding-portion obverse surface 211, the terminal-portion obverse surfaces 221, and the connecting-portion obverse surface 231 that are flush with each other. This makes it possible to bond a large number of wires 71. According to the third embodiment, the second lead 2 has the two wire-bonding-portion reverse surfaces 212 that are spaced apart from each other in the x direction, and the wire-bonding-portion reverse-surface-side recess 213 between the two wire-bonding-portion reverse surfaces 212 is covered with the sealing resin 8. This further reduces the risk of peeling off of the second lead 2 from the sealing resin 8 toward the z2 side in the z direction, as compared to the configuration in the first embodiment.

Figure 9:
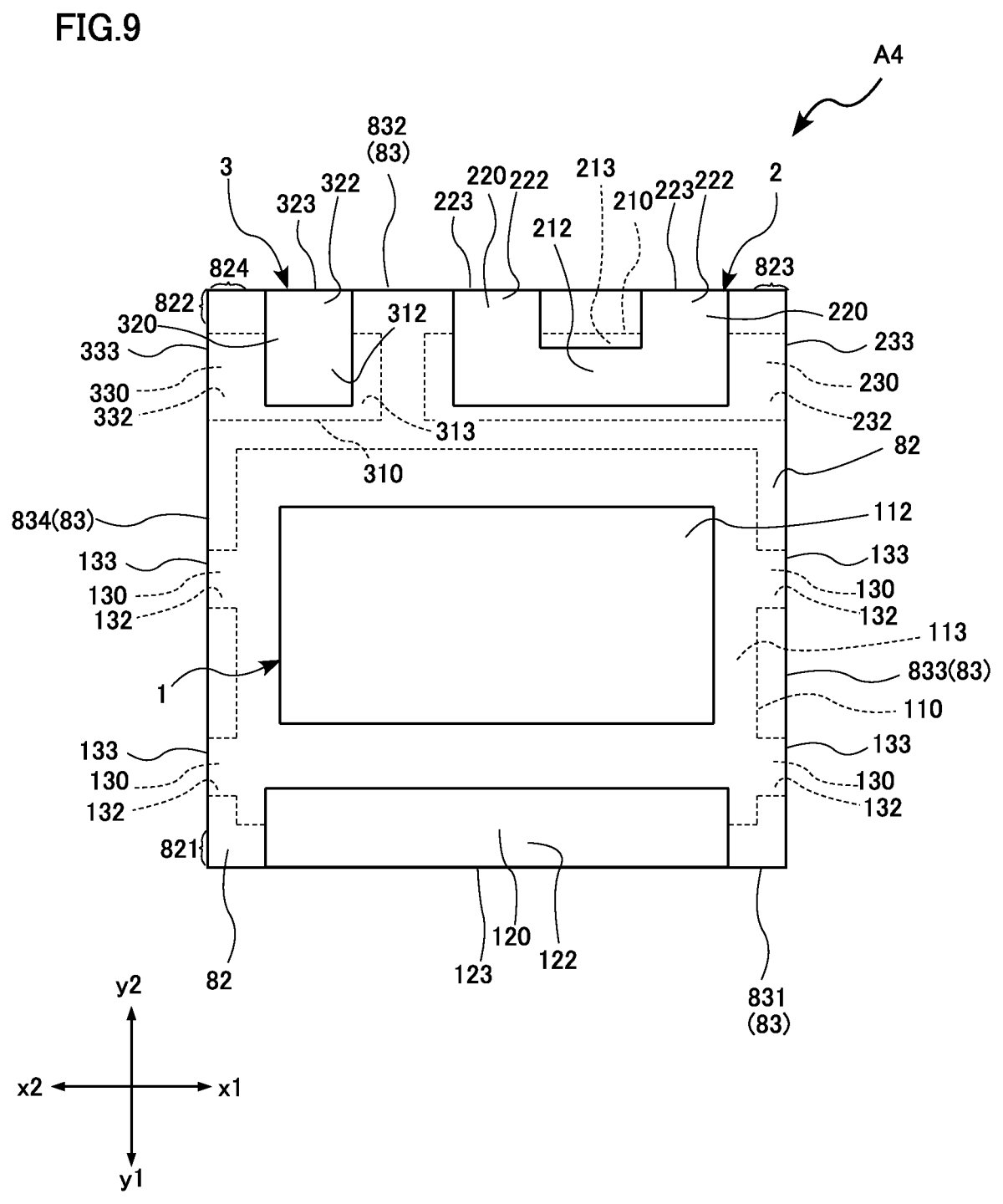

FIG. 9 is a bottom view illustrating a semiconductor device A4 according to a fourth embodiment of the present disclosure, and corresponds to FIG. 4. The semiconductor device A4 according to the present embodiment is different from the semiconductor device A1 according to the first embodiment in the shape of the first lead 1.

The first lead 1 according to the fourth embodiment includes only a single terminal portion 120. The terminal portion 120 is formed by connecting the three terminal portions 120 of the first lead 1 according to the first embodiment into a single terminal portion 120.

In the present embodiment, the first lead 1 and the second lead 2 are also similarly exposed from the opposite end portions of the resin reverse surface 82 in the y direction. As such, the semiconductor device A4 can suppress the occurrence of shorting as compared to the case where the first lead 1 and the second lead 2 are exposed from the same end portion of the resin reverse surface 82. Since the die pad portion 110 of the first lead 1 has the die-pad-portion reverse surface 112 that is exposed from the resin reverse surface 82, the first lead 1 can transfer the heat generated by the semiconductor element 6 to a wiring board so as to dissipate the heat. Furthermore, since the die-pad-portion reverse surface 112 of the first lead 1 is spaced apart from the terminal-portion reverse surface 122, it is possible to further reduce the risk of peeling off of the first lead 1 from the sealing resin 8 toward the z2 side in the z direction. In addition, according to the present embodiment, the second lead 2 has a large integrated surface formed by connecting the wire-bonding-portion obverse surface 211, the terminal-portion obverse surfaces 221, and the connecting-portion obverse surface 231 that are flush with each other. This makes it possible to bond a large number of wires 71. The overall shape of the surface of the second lead 2 that is exposed from the resin reverse surface 82 is a U-shape, and the wire-bonding-portion reverse-surface-side recess 213 is covered with the sealing resin 8 between the two terminal portions 220. This further reduces the risk of peeling off of the second lead 2 from the sealing resin 8 toward the z2 side in the z direction. Since the wire-bonding-portion reverse surface 212 has the shape of a single rectangle elongated in the x direction, the wire-bonding-portion obverse surface 211 provides a large bonding area for stable bonding of the wires 71.

The dimension of the terminal portion 120 in the x direction according to the present embodiment is approximately five times as large as the dimension of each terminal portion 120 in the first embodiment. However, the present disclosure is not limited to this. For example, the dimension of the terminal portion 120 in the x direction may be approximately the same as the dimension of each terminal portion 120 in the x direction according to the first embodiment. In other words, the first lead 1 according to the fourth embodiment may include one of the terminal portions 120 of the first lead 1 according to the first embodiment. Alternatively, the first lead 1 according to the fourth embodiment may include two of the terminal portions 120 of the first lead 1 according to the first embodiment.

Figure 10:
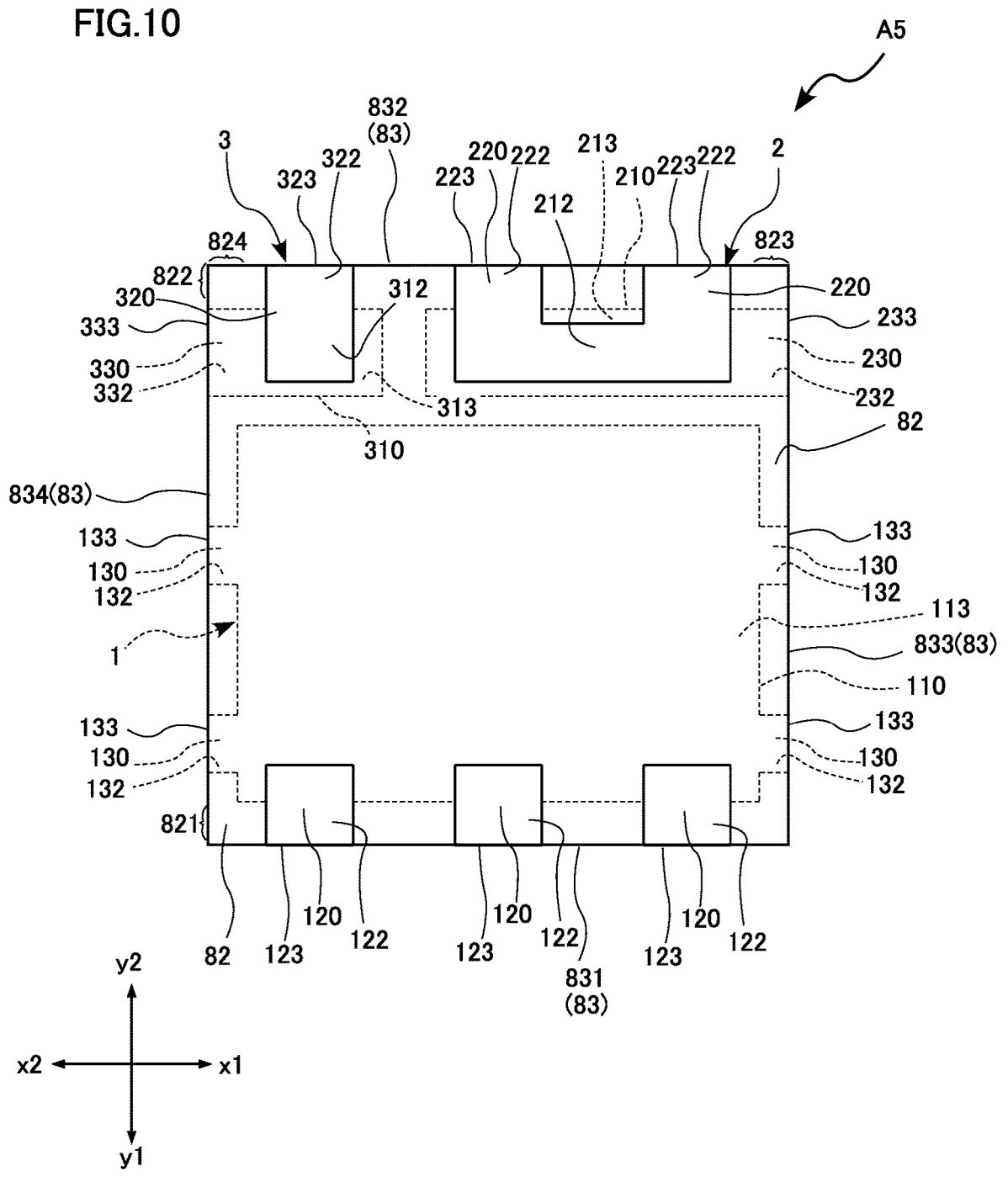
FIG. 10 is a bottom view illustrating a semiconductor device according to a fifth embodiment of the present disclosure.

FIG. 10 is a bottom view illustrating a semiconductor device A5 according to a fifth embodiment of the present disclosure, and corresponds to FIG. 4. The semiconductor device A5 according to the present embodiment is different from the semiconductor device A1 according to the first embodiment in the shape of the first lead 1.

According to the fifth embodiment, the die pad portion 110 of the first lead 1 does not have the die-pad-portion reverse surface 112, and the die pad portion 110 is not exposed from the resin reverse surface 82.

In the present embodiment, the first lead 1 and the second lead 2 are also similarly exposed from the opposite end portions of the resin reverse surface 82 in the y direction. As such, the semiconductor device A5 can suppress the occurrence of shorting as compared to the case where the first lead 1 and the second lead 2 are exposed from the same end portion of the resin reverse surface 82. Furthermore, since the terminal-portion reverse surfaces 122 of the first lead 1 are spaced apart from each other, it is possible to further reduce the risk of peeling off of the first lead 1 from the sealing resin 8 toward the z2 side in the z direction. In addition, the second lead 2 has a large integrated surface formed by connecting the wire-bonding-portion obverse surface 211, the terminal-portion obverse surfaces 221, and the connecting-portion obverse surface 231 that are flush with each other. This makes it possible to bond a large number of wires 71. The overall shape of the surface of the second lead 2 that is exposed from the resin reverse surface 82 is a U-shape, and the wire-bonding-portion reverse-surface-side recess 213 is covered with the sealing resin 8 between the two terminal portions 220. This further reduces the risk of peeling off of the second lead 2 from the sealing resin 8 toward the z2 side in the z direction. Since the wire-bonding-portion reverse surface 212 has the shape of a single rectangle elongated in the x direction, the wire-bonding-portion obverse surface 211 provides a large bonding area for stable bonding of the wires 71. Furthermore, according to the present embodiment, the die pad portion 110 of the first lead 1 is not exposed from the resin reverse surface 82. This further suppresses the occurrence of shorting between the first lead 1 and the second lead 2.

Figure 11:
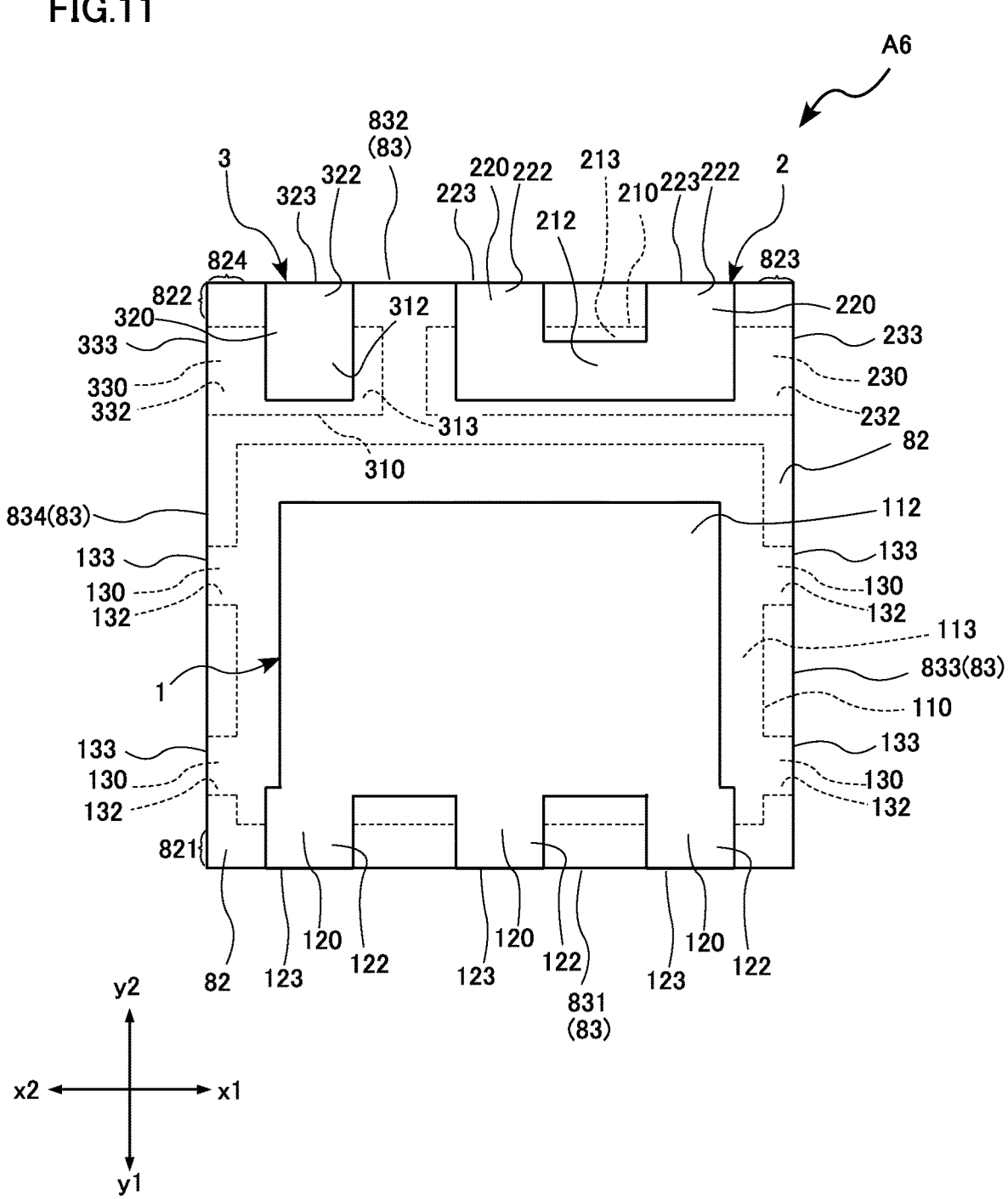
FIG. 11 is a bottom view illustrating a semiconductor device according to a sixth embodiment of the present disclosure.

FIG. 11 is a bottom view illustrating a semiconductor device A6 according to a sixth embodiment of the present disclosure, and corresponds to FIG. 4. The semiconductor device A6 according to the present embodiment is different from the semiconductor device A1 according to the first embodiment in the shape of the first lead 1.

In the first lead 1 according to the sixth embodiment, the die-pad-portion reverse surface 112 is connected to the terminal-portion reverse surfaces 122.

In the present embodiment, the first lead 1 and the second lead 2 are also similarly exposed from the opposite end portions of the resin reverse surface 82 in the y direction. As such, the semiconductor device A6 can suppress the occurrence of shorting as compared to the case where the first lead 1 and the second lead 2 are exposed from the same end portion of the resin reverse surface 82. Since the die pad portion 110 of the first lead 1 has the die-pad-portion reverse surface 112 that is exposed from the resin reverse surface 82, the first lead 1 can transfer the heat generated by the semiconductor element 6 to a wiring board so as to dissipate the heat. Furthermore, since the terminal-portion reverse surfaces 122 of the first lead 1 are spaced apart from each other, it is possible to further reduce the risk of peeling off of the first lead 1 from the sealing resin 8 toward the z2 side in the z direction. In addition, the second lead 2 has a large integrated surface formed by connecting the wire-bonding-portion obverse surface 211, the terminal-portion obverse surfaces 221, and the connecting-portion obverse surface 231 that are flush with each other. This makes it possible to bond a large number of wires 71. The overall shape of the surface of the second lead 2 that is exposed from the resin reverse surface 82 is a U-shape, and the wire-bonding-portion reverse-surface-side recess 213 is covered with the sealing resin 8 between the two terminal portions 220. This further reduces the risk of peeling off of the second lead 2 from the sealing resin 8 toward the z2 side in the z direction. Since the wire-bonding-portion reverse surface 212 has the shape of a single rectangle elongated in the x direction, the wire-bonding-portion obverse surface 211 provides a large bonding area for stable bonding of the wires 71. Furthermore, according to present embodiment, the die-pad-portion reverse surface 112 extends to connect to the terminal-portion reverse surfaces 122. As such, the heat dissipating function is further improved as compared to the configuration in the first embodiment.

Figure 12:
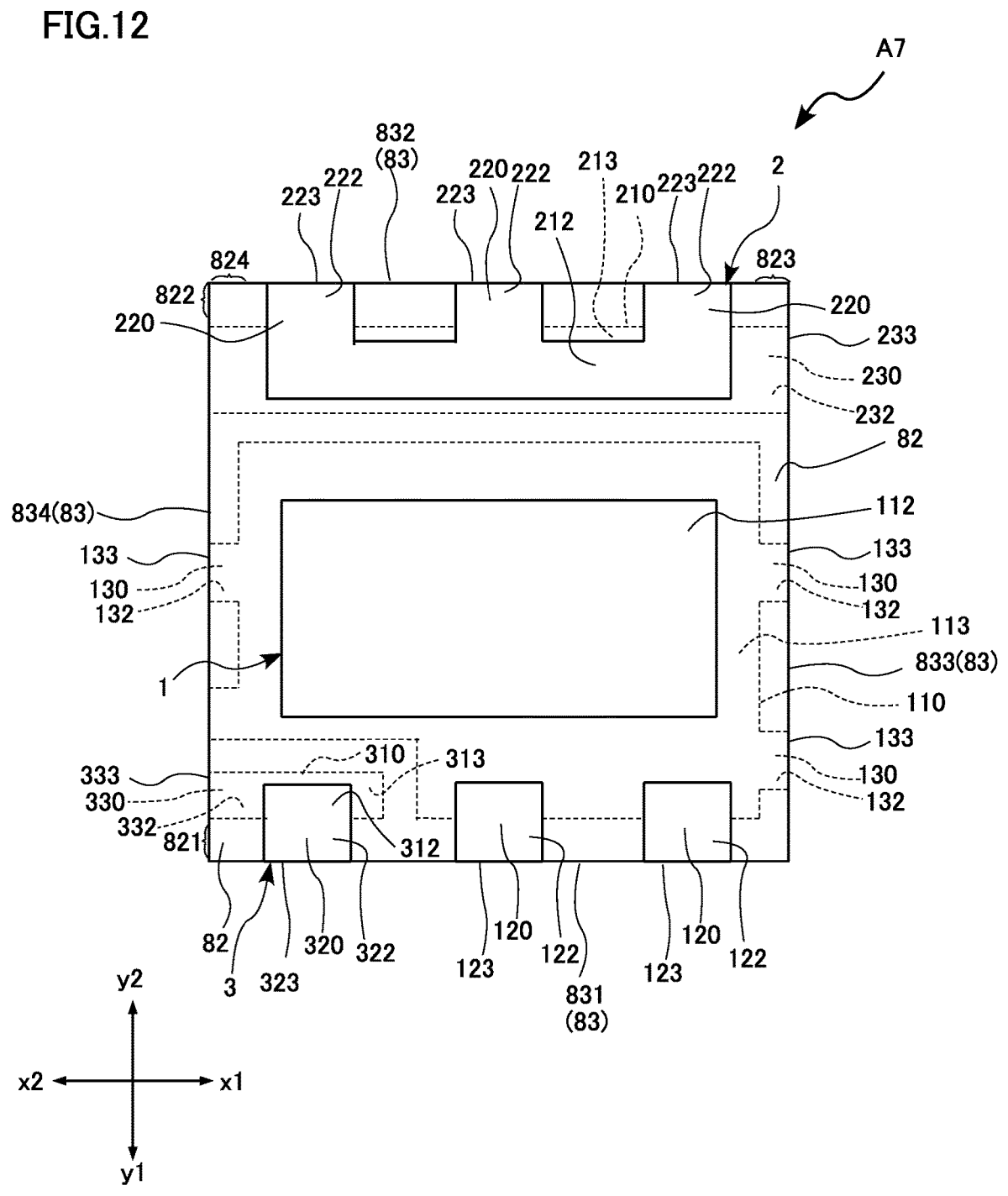

FIG. 12 is a bottom view illustrating a semiconductor device A7 according to a seventh embodiment of the present disclosure, and corresponds to FIG. 4. The semiconductor device A7 according to the present embodiment is different from the semiconductor device A1 according to the first embodiment in the location of the third lead 3.

The third lead 3 according to the seventh embodiment is arranged at the corner of the semiconductor device A7 on the x2 side in the x direction and on the y1 side in the y direction (i.e., the bottom left corner in FIG. 12) as viewed in the z direction. In other words, the second lead 2 and the third lead 3 are arranged on the opposite sides relative to the first lead 1 in the y direction. The second lead 2 extends over the entire semiconductor device A7 in the x direction, and includes three terminal portions 220. On the other hand, the first lead 1 has a cutout portion where the third lead 3 is arranged, and includes two terminal portions 120.

In the present embodiment, the first lead 1 and the second lead 2 are also similarly exposed from the opposite end portions of the resin reverse surface 82 in the y direction. As such, the semiconductor device A7 can suppress the occurrence of shorting as compared to the case where the first lead 1 and the second lead 2 are exposed from the same end portion of the resin reverse surface 82. Since the die pad portion 110 of the first lead 1 has the die-pad-portion reverse surface 112 that is exposed from the resin reverse surface 82, the first lead 1 can transfer the heat generated by the semiconductor element 6 to a wiring board so as to dissipate the heat. Furthermore, the die-pad-portion reverse surface 112 of the first lead 1 is spaced apart from the terminal-portion reverse surfaces 122, and the terminal-portion reverse surfaces 122 are spaced apart from each other as well. This further reduces the risk of peeling off of the first lead 1 from the sealing resin 8 toward the z2 side in the z direction. In addition, the second lead 2 has a large integrated surface formed by connecting the wire-bonding-portion obverse surface 211, the terminal-portion obverse surfaces 221, and the connecting-portion obverse surface 231 that are flush with each other. This makes it possible to bond a large number of wires 71. The overall shape of the surface of the second lead 2 that is exposed from the resin reverse surface 82 is an E-shape, and the wire-bonding-portion reverse-surface-side recess 213 is covered with the sealing resin 8 between three terminal portions 220. This further reduces the risk of peeling off of the second lead 2 from the sealing resin 8 toward the z2 side in the z direction. Since the wire-bonding-portion reverse surface 212 has the shape of a single rectangle elongated in the x direction, the wire-bonding-portion obverse surface 211 provides a large bonding area for stable bonding of the wires 71. Furthermore, according to the present embodiment, the second lead 2 extends over the entire semiconductor device A7 in the x direction. This makes it possible to bond a large number of wires 71.

Although the third lead 3 according to the present embodiment is arranged at the corner of the semiconductor device A7 on the x2 side in the x direction and on the y1 side in the y direction, the present disclosure is not limited to this. For example, the third lead 3 may be arranged in the semiconductor device A7 at the corner on the x1 side in the x direction and on the y1 side in the y direction (i.e., the bottom right corner in FIG. 12). Alternatively, the third lead 3 may be arranged in an area other than a corner.

Figure 13:
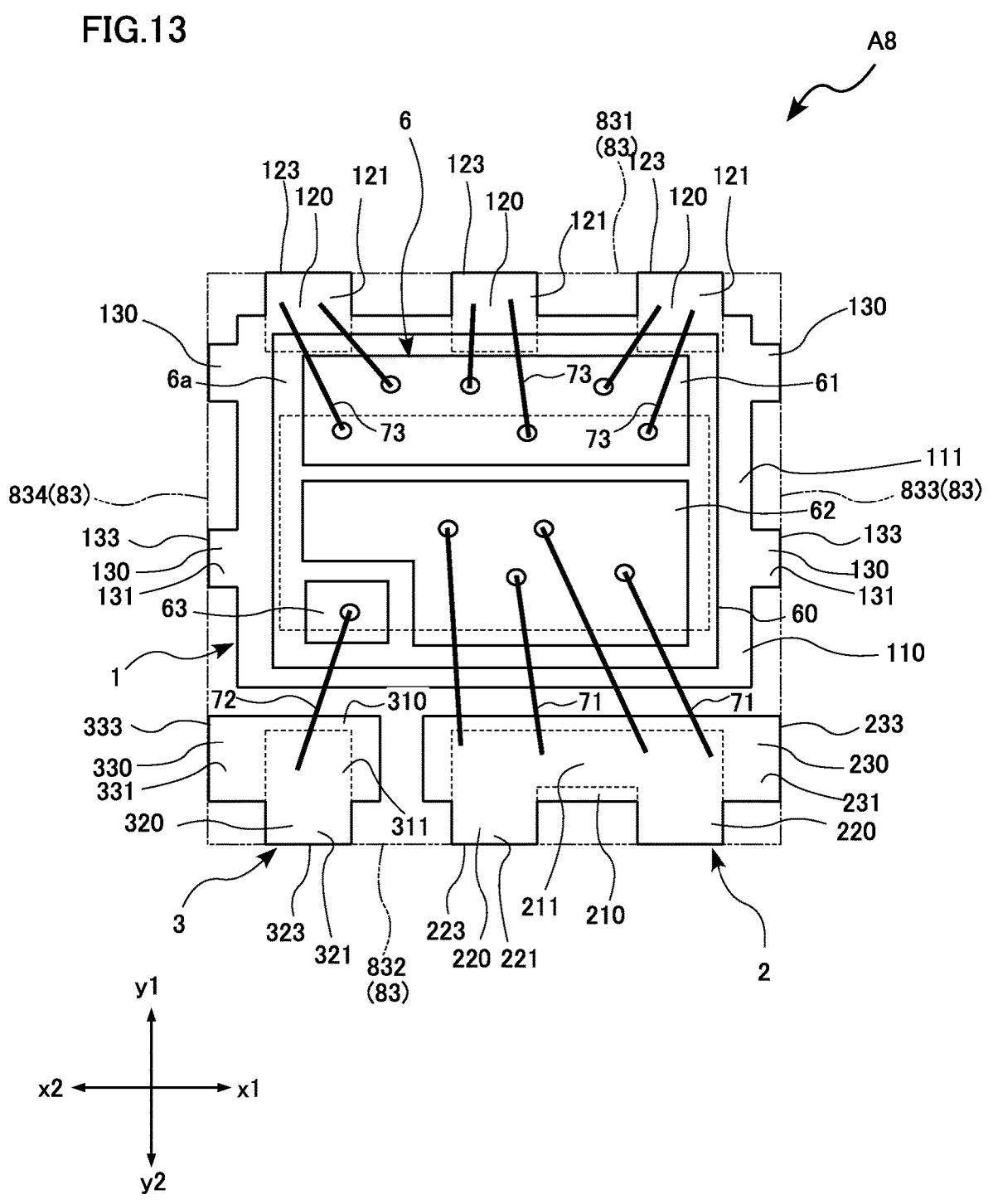
FIG. 13 is a plan view illustrating a semiconductor device according to an eighth embodiment of the present disclosure.

FIG. 13 is a plan view illustrating a semiconductor device A8 according to an eighth embodiment of the present disclosure, and corresponds to FIG. 3. For convenience, FIG. 13 shows the sealing resin 8 in phantom, and the outline of the sealing resin 8 is indicated by an imaginary line (two-dot chain line). The semiconductor device A8 according to the present embodiment is different from the semiconductor device A1 according to the first embodiment in the configuration of the semiconductor element 6.

In the semiconductor element 6 according to the eighth embodiment, the first electrode 61 is arranged on the element obverse surface 6a instead of the element reverse surface 6b. The locations of the first electrode 61, the second electrode 62, and the third electrode 63 on the element obverse surface 6a are not particularly limited. The semiconductor device A8 further includes a plurality of wires 73. The wires 73 are made of the same material as the wires 71 and 72. The wires 73 are connected to the first electrode 61 of the semiconductor element 6 and the terminal-portion obverse surfaces 121 of the first lead 1. As such, the first lead 1 is electrically connected to the first electrode 61 (drain electrode) of the semiconductor element 6 to function as a drain terminal. In the present embodiment, six wires 73 are provided. The number of wires 73 is not particularly limited. Instead of the wires 73, a metal plate made of Cu, for example, may be provided.

In the present embodiment, the first lead 1 and the second lead 2 are also similarly exposed from the opposite end portions of the resin reverse surface 82 in the y direction. As such, the semiconductor device A8 can suppress the occurrence of shorting as compared to the case where the first lead 1 and the second lead 2 are exposed from the same end portion of the resin reverse surface 82. Since the die pad portion 110 of the first lead 1 has the die-pad-portion reverse surface 112 that is exposed from the resin reverse surface 82, the first lead 1 can transfer the heat generated by the semiconductor element 6 to a wiring board so as to dissipate the heat. Furthermore, the die-pad-portion reverse surface 112 of the first lead 1 is spaced apart from the terminal-portion reverse surfaces 122, and the terminal-portion reverse surfaces 122 are spaced apart from each other as well. This further reduces the risk of peeling off of the first lead 1 from the sealing resin 8 toward the z2 side in the z direction. In addition, the second lead 2 has a large integrated surface formed by connecting the wire-bonding-portion obverse surface 211, the terminal-portion obverse surfaces 221, and the connecting-portion obverse surface 231 that are flush with each other. This makes it possible to bond a large number of wires 71. The overall shape of the surface of the second lead 2 that is exposed from the resin reverse surface 82 is a U-shape, and the wire-bonding-portion reverse-surface-side recess 213 is covered with the sealing resin 8 between the two terminal portions 220. This further reduces the risk of peeling off of the second lead 2 from the sealing resin 8 toward the z2 side in the z direction. Since the wire-bonding-portion reverse surface 212 has the shape of a single rectangle elongated in the x direction, the wire-bonding-portion obverse surface 211 provides a large bonding area for stable bonding of the wires 71.

The semiconductor device according to the present disclosure is not limited to the foregoing embodiments. Various design changes can be made to the specific configurations of the elements of the semiconductor device according to the present disclosure. The present disclosure includes the embodiments defined in the following clauses.

Clause 1.

A semiconductor device comprising:

a semiconductor element that is a switching element, the semiconductor element having an element obverse surface and an element reverse surface that face away from each other in a thickness direction;

a first lead on which the semiconductor element is mounted, and that is electrically connected to the semiconductor element;

a second lead that is spaced apart from the first lead in a first direction perpendicular to the thickness direction, the second lead being electrically connected to the semiconductor element; and a sealing resin covering a portion of the first lead, a portion of the second lead, and the semiconductor element, wherein the sealing resin has a resin reverse surface facing in the same direction as the element reverse surface, the resin reverse surface includes a first end portion positioned on a first side in the first direction, a second end portion positioned on a second side in the first direction, a third end portion positioned on a first side in a second direction perpendicular to the thickness direction and the first direction, and a fourth end portion positioned on a second side in the second direction, the first lead is exposed from the first end portion, and is not exposed from any of the second end portion, the third end portion, and the fourth end portion, and the second lead is exposed from the second end portion, and is not exposed from any of the first end portion, the third end portion, and the fourth end portion.

Clause 2.

The semiconductor device according to clause 1, wherein the first lead includes:

a die pad portion on which the semiconductor element is mounted; and a first-lead terminal portion connected to the die pad portion on the first side, and the first-lead terminal portion has a first-lead terminal-portion reverse surface exposed from the resin reverse surface.

Clause 3.

The semiconductor device according to clause 2, wherein the sealing resin further has a first resin side surface connected to the resin reverse surface and arranged on the first side, the first-lead terminal portion further has a first-lead terminal-portion end surface exposed from the first resin side surface, and the first-lead terminal-portion end surface is flush with the first resin side surface.

Clause 4.

The semiconductor device according to clause 2 or 3, wherein the die pad portion has a die-pad-portion reverse surface exposed from the resin reverse surface.

Clause 5.

The semiconductor device according to any of clauses 2 to 4, wherein the first lead further includes a first-lead second terminal portion connected to the die pad portion on the first side, and the first-lead second terminal portion has a first-lead second-terminal-portion reverse surface exposed from the resin reverse surface.

Clause 6.

The semiconductor device according to clause 5, wherein the first lead further includes a first-lead third terminal portion connected to the die pad portion on the first side, and the first-lead third terminal portion has a first-lead third-terminal-portion reverse surface exposed from the resin reverse surface.

Clause 7.

The semiconductor device according to any of clauses 1 to 6, wherein the second lead includes:

a bonding portion; and a second-lead terminal portion connected to the bonding portion on the second side, and the second-lead terminal portion has a second-lead terminal-portion reverse surface exposed from the resin reverse surface.

Clause 8.

The semiconductor device according to clause 7, wherein the sealing resin further has a second resin side surface connected to the resin reverse surface and arranged on the second side, the second-lead terminal portion further has a second-lead terminal-portion end surface exposed from the second resin side surface, and the second-lead terminal-portion end surface is flush with the second resin side surface.

Clause 9.

The semiconductor device according to clause 7 or 8, further comprising a plurality of wires bonded to the semiconductor element and the second lead, wherein the bonding portion has a bonding-portion obverse surface facing in the same direction as the element obverse surface, and the plurality of wires are bonded to the bonding-portion obverse surface.

Clause 10.

The semiconductor device according to any of clauses 7 to 9, wherein the bonding portion has a bonding-portion reverse surface exposed from the resin reverse surface, and the second-lead terminal-portion reverse surface is connected to the bonding-portion reverse surface.

Clause 11.

The semiconductor device according to clause 10, wherein the second lead further includes a second-lead second terminal portion connected to the bonding portion on the second side, the second-lead second terminal portion has a second-lead second-terminal-portion reverse surface exposed from the resin reverse surface, and the second-lead second-terminal-portion reverse surface is connected to the bonding-portion reverse surface.

Clause 12.

The semiconductor device according to any of clauses 1 to 11, further comprising a third lead arranged on the second side in the first direction relative to the first lead, the third lead electrically connected to the semiconductor element, wherein the third lead is exposed from the second end portion.

Clause 13.

The semiconductor device according to clause 12, wherein the semiconductor element is a transistor, and includes a first electrode, a second electrode, and a third electrode, and the first electrode is electrically connected to the first lead, the second electrode is electrically connected to the second lead, and the third electrode is electrically connected to the third lead.

Clause 14.

The semiconductor device according to clause 13, wherein the first electrode is arranged on the element reverse surface, and is bonded to the first lead via a conductive bonding member.

Clause 15.

The semiconductor device according to any of clauses 1 to 14, having a dimension of 1 mm to 3 mm in the first direction, and a dimension of 1 mm to 3 mm in the second direction.

REFERENCE SIGNS

A1-A8: Semiconductor device 1: First lead
110: Die pad portion 111: Die-pad-portion obverse surface
112: Die-pad-portion reverse surface
113: Die-pad-portion reverse-surface-side recess
120: Terminal portion 121: Terminal-portion obverse surface
122: Terminal-portion reverse surface
123: Terminal-portion end surface

130: Connecting portion

131: Connecting-portion obverse surface

132: Connecting-portion reverse surface

133: Connecting-portion end surface

2: Second lead 210: Wire bonding portion

211: Wire-bonding-portion obverse surface

212: Wire-bonding-portion reverse surface

213: Wire-bonding-portion reverse-surface-side recess

220: Terminal portion

221: Terminal-portion obverse surface

222: Terminal-portion reverse surface

223: Terminal-portion end surface 230: Connecting portion

231: Connecting-portion obverse surface

232: Connecting-portion reverse surface

233: Connecting-portion end surface 3: Third lead

310: Wire bonding portion

311: Wire-bonding-portion obverse surface

312: Wire-bonding-portion reverse surface

313: Wire-bonding-portion reverse-surface-side recess

320: Terminal portion

321: Terminal-portion obverse surface

322: Terminal-portion reverse surface

323: Terminal-portion end surface 330: Connecting portion

331: Connecting-portion obverse surface

332: Connecting-portion reverse surface

333: Connecting-portion end surface 6: Semiconductor element

60: Element body 6*a*: Element obverse surface

6*b*: Element reverse surface 61: First electrode

62: Second electrode 63: Third electrode

71, 72, 73: Wire 75: Bonding member

8: Sealing resin 81: Resin obverse surface

82: Resin reverse surface 821: First end portion

822: Second end portion 823: Third end portion

824: Fourth end portion 83: Resin side surface

831: First resin side surface 832: Second resin side surface

833: Third resin side surface 834: Fourth resin side surface

The invention claimed is:

1. A semiconductor device comprising:

a semiconductor element that is a switching element, the semiconductor element having an element obverse surface and an element reverse surface that face away from each other in a thickness direction;

a first lead on which the semiconductor element is mounted, and that is electrically connected to the semiconductor element;

a second lead that is spaced apart from the first lead in a first direction perpendicular to the thickness direction, the second lead being electrically connected to the semiconductor element; and a sealing resin covering a portion of the first lead, a portion of the second lead, and the semiconductor element, wherein the sealing resin has a resin reverse surface facing in a same direction as the element reverse surface, the resin reverse surface includes a first end portion positioned on a first side in the first direction, a second end portion positioned on a second side in the first direction, a third end portion positioned on a first side in a second direction perpendicular to the thickness direction and the first direction, and a fourth end portion positioned on a second side in the second direction, the first lead is exposed from the first end portion, and is not exposed from any of the second end portion, the third end portion, and the fourth end portion, the second lead is exposed from the second end portion, and is not exposed from any of the first end portion, the third end portion, and the fourth end portion, the first lead includes a die pad portion on which the semiconductor element is mounted, and a first-lead terminal portion connected to the die pad portion on the first side, the die pad portion has a die-pad-portion obverse surface and a die-pad-portion reverse surface that face away from each other in the thickness direction, and the die pad portion is formed with a die-pad-portion reverse-surface-side recess that recesses from the die-pad-portion reverse surface toward the die-pad-portion obverse surface, the die-pad-portion reverse surface is exposed from the resin reverse surface, the die-pad-portion reverse-surface-side recess is covered by the sealing resin, the second lead includes: a bonding portion; and a second-lead terminal portion connected to the bonding portion on the second side, the second-lead terminal portion having a second-lead terminal-portion reverse surface exposed from the resin reverse surface, the bonding portion has a bonding-portion reverse surface exposed from the resin reverse surface, the second-lead terminal-portion reverse surface being connected to the bonding-portion reverse surface, the second lead further includes a second-lead second terminal portion connected to the bonding portion on the second side, the second-lead second terminal portion having a second-lead second-terminal-portion reverse surface exposed from the resin reverse surface, the second-lead second-terminal-portion reverse surface being connected to the bonding-portion reverse surface, the second-lead terminal-portion reverse surface and the second-lead second-terminal-portion reverse surface are spaced apart from each other in the second direction, the second lead having an exposed surface of U shape exposed from the resin reverse surface, the U shape being open on the second side in the first direction, and the bonding portion is formed with a bonding-portion reverse-surface-side recess that recesses from the bonding-portion reverse surface in the thickness direction, the bonding-portion reverse-surface-side recess being disposed between the second-lead terminal-portion reverse surface and the second-lead second-terminal-portion reverse surface.

2. The semiconductor device according to claim 1, wherein the sealing resin further has a second resin side surface connected to the resin reverse surface and arranged on the second side, the second-lead terminal portion further has a second-lead terminal-portion end surface exposed from the second resin side surface, and the second-lead terminal-portion end surface is flush with the second resin side surface.

3. The semiconductor device according to claim 1, further comprising a plurality of wires bonded to the semiconductor element and the second lead, wherein the bonding portion has a bonding-portion obverse sur-
face facing in the same direction as the element obverse
surface, and
the plurality of wires are bonded to the bonding-portion
obverse surface.

4. The semiconductor device according to claim 1, having
a dimension of 1 mm to 3 mm in the first direction, and a
dimension of 1 mm to 3 mm in the second direction.

5. The semiconductor device according to claim 1,
wherein the die-pad-portion reverse-surface-side recess
includes an elongated part that extends along the second
direction and passes between the die-pad-portion reverse
surface and the first-lead terminal portion.

6. The semiconductor device according to claim 1,
wherein the die-pad-portion reverse-surface-side recess sur-
rounds an entirety of the die-pad-portion reverse surface as
viewed in the thickness direction.

7. The semiconductor device according to claim 1,
wherein
the first-lead terminal portion has a first-lead terminal-
portion reverse surface exposed from the resin reverse
surface.

8. The semiconductor device according to claim 7,
wherein
the sealing resin further has a first resin side surface
connected to the resin reverse surface and arranged on
the first side,
the first-lead terminal portion further has a first-lead
terminal-portion end surface exposed from the first
resin side surface, and
the first-lead terminal-portion end surface is flush with the
first resin side surface.

9. The semiconductor device according to claim 7,
wherein the die-pad-portion reverse surface and the first-
lead terminal-portion reverse surface are spaced apart from
each other in the first direction.

10. The semiconductor device according to claim 1,
wherein
the first lead further includes a first-lead second terminal
portion connected to the die pad portion on the first
side, and the first-lead second terminal portion has a first-lead
second-terminal-portion reverse surface exposed from
the resin reverse surface.

11. The semiconductor device according to claim 10,
wherein
the first lead further includes a first-lead third terminal
portion connected to the die pad portion on the first
side, and
the first-lead third terminal portion has a first-lead third-
terminal-portion reverse surface exposed from the resin
reverse surface.

12. The semiconductor device according to claim 1,
further comprising
a third lead arranged on the second side in the first
direction relative to the first lead, the third lead elec-
trically connected to the semiconductor element,
wherein
the third lead is exposed from the second end portion.

13. The semiconductor device according to claim 12,
wherein
the semiconductor element is a transistor, and includes a
first electrode, a second electrode, and a third electrode,
and
the first electrode is electrically connected to the first lead,
the second electrode is electrically connected to the
second lead, and the third electrode is electrically
connected to the third lead.

14. The semiconductor device according to claim 13,
wherein the first electrode is arranged on the element reverse
surface, and is bonded to the first lead via a conductive
bonding member.

15. The semiconductor device according to claim 13,
further comprising a first wire, a second wire, and a third
wire, wherein the first electrode, the second electrode, and
the third electrode are disposed on the element obverse
surface,
the first electrode and the first lead are electrically con-
nected to each other via the first wire,
the second electrode and the second lead are electrically
connected to each other via the second wire, and
the third electrode and the third lead are electrically
connected to each other via the third wire.

* * * * *